US012777860B2

(12) United States Patent
Tahara et al.

(10) Patent No.: US 12,777,860 B2
(45) Date of Patent: Oct. 27, 2026

(54) SUBSTRATE TREATMENT METHOD AND SUBSTRATE TREATMENT DEVICE

(71) Applicant: SCREEN Holdings Co., Ltd., Kyoto (JP)

(72) Inventors: Kana Tahara, Kyoto (JP); Yukifumi Yoshida, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 337 days.

(21) Appl. No.: 18/550,235

(22) PCT Filed: Jan. 18, 2022

(86) PCT No.: PCT/JP2022/001503

§ 371 (c)(1),
(2) Date: Sep. 12, 2023

(87) PCT Pub. No.: WO2022/196077

PCT Pub. Date: Sep. 22, 2022

(65) Prior Publication Data

US 2024/0153779 A1 May 9, 2024

(30) Foreign Application Priority Data

Mar. 19, 2021 (JP) ................................ 2021-046461

(51) Int. Cl.
*H10P 50/28* (2026.01)
*H10P 14/60* (2026.01)
(Continued)

(52) U.S. Cl.
CPC ........ *H10P 50/283* (2026.01); *H10P 14/6309* (2026.01); *H10P 70/23* (2026.01); *H10P 72/0424* (2026.01)

(58) Field of Classification Search
CPC .... H10P 50/283; H10P 14/6309; H10P 70/23; H10P 72/0424; C23F 1/14
(Continued)

(56) References Cited

U.S. PATENT DOCUMENTS

2005/0209119 A1* 9/2005 Ishikawa ............... H10F 71/138 257/E21.309
2010/0035436 A1* 2/2010 Kim ....................... C09K 13/08 252/79.3
(Continued)

FOREIGN PATENT DOCUMENTS

JP H06-314679 A 11/1994
JP H10-293294 A 11/1998
(Continued)

OTHER PUBLICATIONS

International Search Report mailed Apr. 5, 2022 in corresponding PCT International Application No. PCT/JP2022/001503.
(Continued)

*Primary Examiner* — Duy Vu N Deo
(74) *Attorney, Agent, or Firm* — OSTROLENK FABER LLP

(57) ABSTRACT

A substrate processing method includes a substrate preparation step of preparing a substrate having a major surface from which a first oxide layer is exposed, a first etching step of forming a first polymer film that contains a first acid polymer on the major surface of the substrate and etching the substrate, and a first rinsing step of supplying a first rinsing liquid that washes the major surface of the substrate to the major surface of the substrate after the first etching step.

14 Claims, 14 Drawing Sheets

(51) Int. Cl.
*H10P 70/00* (2026.01)
*H10P 72/00* (2026.01)

(58) Field of Classification Search
USPC ............................................................ 216/83
See application file for complete search history.

(56) References Cited

U.S. PATENT DOCUMENTS

| | | | | |
|---|---|---|---|---|
| 2011/0111599 | A1* | 5/2011 | Lennon | H10F 77/211 257/E21.486 |
| 2012/0196444 | A1* | 8/2012 | Lennon | H10F 71/137 257/E21.249 |
| 2015/0187965 | A1 | 7/2015 | Stockum et al. | |
| 2020/0168467 | A1 | 5/2020 | Higuchi et al. | |
| 2020/0303207 | A1 | 9/2020 | Higuchi et al. | |

FOREIGN PATENT DOCUMENTS

| | | | |
|---|---|---|---|
| JP | 2001-284355 | A | 10/2001 |
| JP | 2004-125882 | A | 4/2004 |
| JP | 2011-511442 | A | 4/2011 |
| JP | 2015-522951 | A | 8/2015 |
| JP | 2017-162908 | A | 9/2017 |
| JP | 2020-088178 | A | 6/2020 |
| KR | 10-2003-0055388 | A | 7/2003 |
| WO | WO 2017/086112 | A1 | 5/2017 |

OTHER PUBLICATIONS

International Preliminary Report on Patentability (Chapter I) mailed Sep. 28, 2023 with a Notification from the International Bureau (Form PCT/IB/326) in corresponding PCT International Application No. PCT/JP2022/001503 in Japanese.

English translation of the International Preliminary Report on Patentability (Chapter I) mailed Sep. 28, 2023 with a Notification from the International Bureau (Form PCT/IB/338) in corresponding PCT International Application No. PCT/JP2022/001503 with a Notification from the International Bureau (Form PCT/IB/338).

* cited by examiner

SUBSTRATE TREATMENT METHOD AND SUBSTRATE TREATMENT DEVICE

CROSS-REFERENCE TO RELATED APPLICATIONS

The present application is a 35 U.S.C. §§ 371 national stage application of International Application No. PCT/JP2022/001503 filed Jan. 18, 2022, which claims priority to Japanese Patent Application No. 2021-046461, filed Mar. 19, 2021, the contents of which are incorporated herein by reference.

TECHNICAL FIELD

The present invention relates to a substrate processing method for processing a substrate and a substrate processing apparatus that processes a substrate.

Examples of substrates to be processed include semiconductor wafers, substrates for FPDs (Flat Panel Displays) such as liquid crystal displays or organic EL (Electroluminescence) displays, substrates for optical disks, substrates for magnetic disks, substrates for magneto-optical disks, substrates for photomasks, ceramic substrates, substrates for solar batteries, etc.

BACKGROUND ART

Patent Literature 1 shown below discloses substrate processing in which a desired amount of etching is achieved by repeatedly performing a step of supplying an oxidation fluid, such as hydrogen peroxide water ($H_2O_2$ water) to a substrate and forming a metal oxide layer and a step of supplying an etching liquid, such as diluted hydrofluoric acid (DHF), to the substrate and removing the metal oxide layer.

CITATION LIST

Patent Literature

Patent Literature 1: United States Patent Application Publication No. 2020/303207

SUMMARY OF INVENTION

Technical Problem

In the substrate processing of Patent Literature 1, the metal oxide layer is etched by repeatedly performing the formation of the metal oxide layer and the removal of the metal oxide layer.

However, in the substrate processing of Patent Literature 1, processing by use of continuously-flowing diluted hydrofluoric acid and hydrogen peroxide water is employed in each of the formation and the removal of the metal oxide layer. Therefore, there is a need to use a great amount of chemical liquid, such as diluted hydrofluoric acid and hydrogen peroxide water, in the substrate processing, and therefore the problem of an environmental load arises.

Therefore, an object of the present invention is to provide a substrate processing method and a substrate processing apparatus both of which are capable of reducing an environmental load while excellently etching a substrate.

Solution to Problem

A preferred embodiment of the present invention provides a substrate processing method including a substrate preparation step of preparing a substrate having a major surface from which a first oxide layer is exposed, a first etching step of forming a first polymer film that contains a first acid polymer on the major surface of the substrate and etching the substrate, and a first rinsing step of supplying a first rinsing liquid that washes the major surface of the substrate to the major surface of the substrate after the first etching step.

According to this substrate processing method, the first polymer film is formed on the major surface of the substrate, and the substrate is etched, and therefore the first oxide layer is removed from the substrate. Thereafter, the major surface of the substrate is washed by the first rinsing liquid, and therefore the polymer film is removed from the major surface of the substrate. Therefore, it is possible to start the etching of the substrate by the formation of the polymer film, and is possible to remove the polymer film from the major surface of the substrate, and is possible to stop the etching of the substrate. Therefore, it is possible to adjust the amount of etching applied to the substrate by the formation and the removal of the polymer film, thereby making it possible to excellently etch the substrate.

The first polymer film used to etch the substrate is semisolid or solid because the first polymer film contains the first acid polymer. Therefore, the first polymer film stays on the major surface of the substrate more easily than a liquid. Therefore, there is no need to continuously supply the first acid polymer to the major surface of the substrate during an entire period of time during which the substrate is etched. In other words, at least after forming the first polymer film, there is no need to additionally supply the first acid polymer to the upper surface of the substrate. Therefore, it is possible to reduce an environmental load.

In a preferred embodiment of the present invention, the first polymer film additionally contains a first alkali component. The first etching step includes a first etching start step of starting etching the substrate by heating the first polymer film and evaporating the first alkali component from the first polymer film after the first polymer film is formed.

According to this arrangement, the first alkali component is contained in the first polymer film together with the acid polymer. Therefore, until the polymer film is heated after the polymer film is formed, the acid polymer is neutralized by the alkaline component, and is in a substantially deactivated state. Therefore, until the polymer film is heated after the polymer film is formed, the etching of the substrate is hardly started. The first acid polymer in the first polymer film regains activity by heating the first polymer film and by evaporating the first alkaline component, and the etching of the substrate is started. Therefore, it is possible to accurately etch the substrate. Particularly, it is possible to accurately control the starting timing of the etching of the substrate.

In a preferred embodiment of the present invention, the first polymer film additionally contains a first electroconductive polymer. Therefore, it is possible to facilitate ionization of the acid polymer in the polymer film by the action of the electroconductive polymer. Therefore, it is possible to allow the acid polymer to effectively act on the oxide layer.

In other words, the first electroconductive polymer functions as a medium for allowing the first acid polymer to release protons (hydrogen ions). Therefore, if the electroconductive polymer is contained in the first polymer film, it is possible to ionize the first acid polymer and to allow the first acid polymer that has been ionized to act on the oxide layer even if a liquid component, such as solvent, has been completely eliminated from the first polymer film.

In a preferred embodiment of the present invention, the first etching step includes a first oxide layer removing step of removing at least a portion of the first oxide layer by the acid polymer in the first polymer film. The first rinsing step includes a first polymer-film removing step of removing the first polymer film from the major surface of the substrate by the first rinsing liquid.

According to this substrate processing method, at least a portion of the first oxide layer exposed from the major surface of the substrate is removed by the first acid polymer contained in the first polymer film. Additionally, it is possible to remove the first polymer film from the major surface of the substrate by means of the first rinsing liquid. Therefore, it is possible to etch the substrate by the formation and the removal of the first polymer film more excellently.

In a preferred embodiment of the present invention, the first etching step and the first rinsing step are each performed at least once more in this order after the first rinsing step.

According to this substrate processing method, the first etching step and the first rinsing step are each performed at least once more in this order after the first rinsing step is performed. In other words, the formation and the removal of the first polymer film are performed a plurality of times. The substrate can be sufficiently etched by performing the formation and the removal of the first polymer film a plurality of times even if the substrate is not sufficiently etched by performing the formation and the removal of the first polymer film once. Particularly, the first oxide layer can be sufficiently etched by performing the formation and the removal of the first polymer film a plurality of times even if a desired amount of the first oxide layer is not etched by performing the formation and the removal of the first polymer film once. For example, the first oxide layer may be thoroughly removed from the substrate by performing the formation and the removal of the first polymer film a plurality of times.

Additionally, the first etching step is again performed subsequent to the first rinsing step when the formation and the removal of the first polymer film are performed a plurality of times. Therefore, the first polymer film formed on the major surface of the substrate is temporarily removed, and then the first polymer film is again formed on the major surface of the substrate. Therefore, it is possible to remove the first polymer film in which the first acid polymer has been consumed by etching the substrate from on the major surface of the substrate, and is possible to etch the substrate by means of a new first polymer film. Therefore, a substance required to etch the substrate is enabled to be made smaller in amount used than a configuration in which the substrate is etched by repeatedly supplying a liquid oxidant, such as a diluted hydrofluoric acid, and an etching liquid, such as hydrogen peroxide water.

In a preferred embodiment of the present invention, the substrate processing method additionally includes a first liquid removing step of removing the first rinsing liquid from the major surface of the substrate after the first rinsing step is completed and before the first etching step subsequent to the first rinsing step is started.

According to this substrate processing method, the first rinsing liquid is removed from the major surface of the substrate after the first polymer film is removed by the first rinsing liquid and before the first polymer film is newly formed. Therefore, it is possible to prevent the polymer film, which is being formed, from being removed by the rinsing liquid remaining on the major surface of the substrate. This enables the first polymer film to sufficiently exhibit the etching action of the substrate, thereby making it possible to increase the amount of etching of the substrate by forming the first polymer film once. As a result, it is possible to make a substance required to etch the substrate even smaller in amount used, thereby making it possible to reduce an environmental load.

If a configuration is employed in which the first rinsing liquid is removed from the major surface of the substrate and then the major surface of the substrate is dried, it is possible to more excellently prevent the first rinsing liquid from remaining on the major surface of the substrate when the first etching step is started.

In a preferred embodiment of the present invention, the substrate processing method additionally includes a polymer-containing liquid supplying step of supplying a polymer-containing liquid that contains a solvent and the first acid polymer to the major surface of the substrate before the first etching step. The first etching step includes a step of forming the first polymer film by evaporating at least a portion of the solvent in the polymer-containing liquid on the major surface of the substrate.

According to this substrate processing method, it is possible to form the first polymer film by evaporating a solvent from a polymer-containing liquid supplied to the front surface of the substrate. Therefore, it is possible to raise the concentration of an acid polymer contained in the first polymer film by evaporating the solvent. Therefore, a high-concentrated acid polymer is enabled to act on the substrate. Therefore, it is possible to swiftly etch the substrate. Particularly, it is possible to swiftly etch the first oxide layer.

In a preferred embodiment of the present invention, the substrate processing method additionally includes an oxidation step of applying oxidation treatment onto the major surface of the substrate after the last first rinsing step, a second etching step of forming a semisolid or solid second polymer film that contains a second acid polymer on the major surface of the substrate and etching the substrate after the oxidation step, and a second rinsing step of supplying the second rinsing liquid to the major surface of the substrate after the second etching step.

According to this substrate processing method, the last first rinsing step is performed, and then oxidation treatment is applied onto the major surface of the substrate, and then the substrate is etched. Therefore, it is possible to sufficiently secure the amount of etching by additionally etching the substrate. Therefore, it is possible to etch the substrate more excellently.

In a preferred embodiment of the present invention, the second polymer film additionally contains a second alkali component. The second etching step includes a second etching start step of starting etching the substrate by heating the second polymer film and by evaporating the second alkali component from the second polymer film after the second polymer film is formed.

According to this configuration, the second alkali component is contained in the second polymer film together with the second acid polymer. Therefore, until the second polymer film is heated after the second polymer film is formed, the second acid polymer is neutralized by the second alkaline component, and is in a substantially deactivated state. Therefore, until the second polymer film is heated after the second polymer film is formed, the etching of the substrate is hardly started. The second acid polymer in the second polymer film regains activity by heating the second polymer film and by evaporating the alkaline component, and the etching of the substrate is started. Therefore, it is possible to accurately etch the substrate. Particularly, it is possible to accurately control the starting timing of the etching of the substrate.

In a preferred embodiment of the present invention, the second polymer film additionally contains a second electroconductive polymer. Therefore, it is possible to facilitate ionization of the acid polymer in the second polymer film by the action of the second electroconductive polymer. Therefore, it is possible to allow the second acid polymer to effectively act on the oxide layer.

In other words, the second electroconductive polymer functions as a medium for allowing the second acid polymer to release protons (hydrogen ions). Therefore, if the second electroconductive polymer is contained in the second polymer film, it is possible to ionize the second acid polymer and to allow the second acid polymer that has been ionized to act on the oxide layer even if a liquid component, such as solvent, has been completely eliminated from the second polymer film.

In a preferred embodiment of the present invention, the oxidation step includes a second oxide layer forming step of forming a second oxide layer at a surface layer portion of the major surface of the substrate. The second etching step includes a second oxide layer removing step of removing at least a portion of the second oxide layer by the second acid polymer in the second polymer film. The second rinsing step includes a second polymer-film removing step of removing the second polymer film from the major surface of the substrate by the second rinsing liquid after the second etching step.

According to this substrate processing method, the first oxide layer exposed from the major surface of the substrate before substrate processing is started is removed by the first polymer film, and then the second oxide layer is formed at the surface layer portion of the major surface of the substrate by oxidation treatment. Thereafter, oxidation treatment is performed, and then the formation and the removal of the second polymer film are performed, and, as a result, the substrate is further etched. Therefore, if the amount of etching of the substrate is insufficient only by the removal of the first oxide layer, it is possible to sufficiently secure the amount of etching by additionally forming the second oxide layer and then removing the second oxide layer.

Additionally, a film (second polymer film) that contains the second acid polymer is used when the second oxide layer is removed in the same way as when the first oxide layer is removed. Therefore, it is possible to make a substance required to etch the substrate smaller in amount used, thereby making it possible to reduce an environmental load.

In a preferred embodiment of the present invention, the oxidation step, the second etching step, and the second rinsing step are each performed at least once more in this order after the second rinsing step.

According to this substrate processing method, the oxidation step, the second etching step, and the second rinsing step are repeatedly performed. In other words, the oxidation and the etching of the substrate are performed a plurality of times. Therefore, it is possible to sufficiently secure the amount of etching by additionally etching the substrate a plurality of times.

In detail, the formation and the removal of the second oxide layer are alternately performed a plurality of times. Therefore, the formation and the removal of the second oxide layer that is small in amount (for example, not less than 1 nm and not more than 10 nm) can be repeatedly performed. Therefore, it is possible to more easily adjust the amount of etching of the substrate than in a case in which the formation and the removal of the second oxide layer that is large in amount are performed at a time. As a result, it is possible to accurately etch the substrate.

In a preferred embodiment of the present invention, the first acid polymer is a carboxyl-containing polymer, a sulfo-containing polymer, or a mixture of these polymers. If the first acid polymer is any one of these polymers, it is possible to use water, such as DIW (Deionized Water), as a liquid that dissolves the first acid polymer. Therefore, there is no need to use an organic solvent as a solvent that dissolves the first acid polymer. Additionally, there is no need to use an organic solvent as a first rinsing liquid that removes the first polymer film. Therefore, it is possible to further reduce an environmental load.

Another preferred embodiment of the present invention provides a substrate processing apparatus that etches a substrate having a major surface from which an oxide layer is exposed. The substrate processing apparatus includes a polymer-film forming unit that forms a semisolid or solid polymer film containing an acid polymer on the major surface of the substrate and a rinsing liquid supply unit that supplies a rinsing liquid that washes the major surface of the substrate to the major surface of the substrate. With this substrate processing apparatus, it is possible to perform the above-described substrate processing method, and therefore the same effect as the above-described substrate processing method is fulfilled.

The above and other objects, features, and advantages of the present invention will become more apparent from the following detailed description of the preferred embodiments with reference to the attached drawings.

DESCRIPTION OF EMBODIMENTS

<Structure of Surface Layer Portion of Substrate to be Processed>

Figure 1:
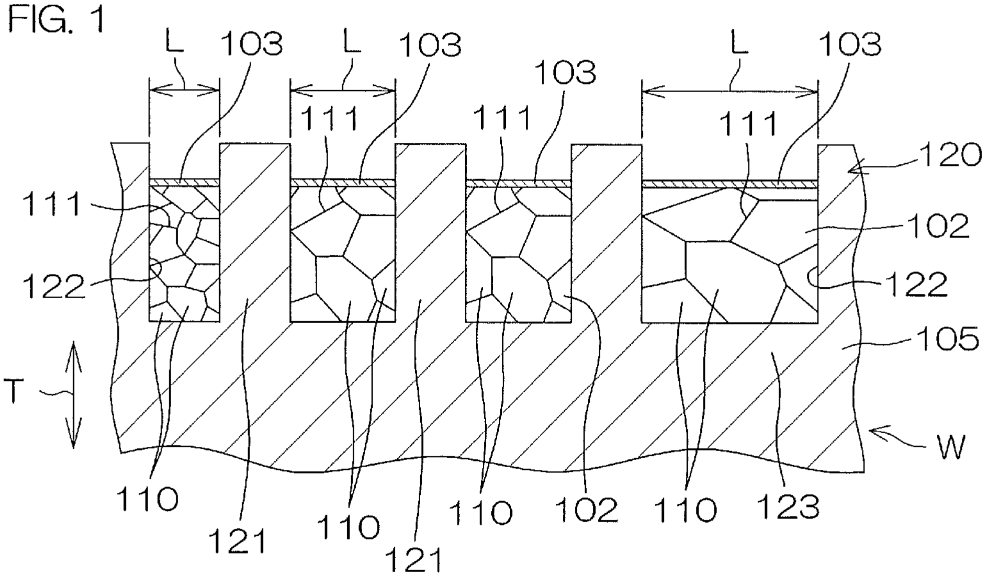
FIG. 1 is a schematic cross-sectional view for describing a structure of a surface layer portion of a substrate to be processed.

FIG. 1 is a schematic cross-sectional view for describing a structure of a surface layer portion of a substrate W to be processed. The substrate W is a substrate such as a silicon wafer, and has a pair of major surfaces. At least one of the pair of major surfaces is a device surface on which a concavo-convex pattern 120 is formed. One of the pair of major surfaces may be a non-device surface on which the concavo-convex pattern 120 is not formed.

For example, an insulation layer 105 in which a plurality of trenches 122 are formed, a to-be-processed layer 102 formed in each of the trenches 122 so as to expose its front surface, and a first oxide layer 103 layered on the to-be-processed layer 102 are formed at the surface layer portion of the device surface.

The insulation layer 105 has a fine convex structure 121 placed between the trenches 122 adjoining each other and a bottom defining portion 123 that defines a bottom portion of the trench 122. The concavo-convex pattern 120 includes the plurality of structures 121 and the plurality of trenches 122. A front surface of the to-be-processed layer 102 and a front surface of the insulation layer 105 (structure 121) compose at least a portion of the major surface of the substrate W.

For example, the insulation layer 105 is a silicon oxide ($SiO_2$) layer or a low-permittivity layer. The low-permittivity layer is made of low-permittivity (Low-k) material that is lower in permittivity than silicon oxide. In detail, the low-permittivity layer is made of insulation material (SiOC) in which carbon is added to silicon oxide.

For example, the to-be-processed layer 102 is a metal layer, a silicon layer, or the like. A typical metal layer is a copper wiring. The metal layer is formed by crystal growth through an electroplating technique or the like while using a seed layer (not shown) formed in the trench 122 as a nucleus by, for example, a sputtering method. The metal-layer forming method is not limited to this method. The metal layer may be formed only by sputtering, or may be formed by another method.

The first oxide layer 103 is, for example, a metal oxide layer, a silicon oxide layer, or the like. A typical metal oxide layer is a copper oxide layer. The first oxide layer 103 may be formed by allowing a surface layer portion of the to-be-processed layer 102 to be oxidized by, for example, an anodic oxidation method, a thermal oxidation method, an ashing method, or the like, or may be formed on a front surface of the to-be-processed layer 102 by a chemical vapor deposition (CVD) method or the like. Additionally, the first oxide layer 103 may be a natural oxide film.

A barrier layer and a liner layer (not shown) may be provided between the to-be-processed layer 102 and the insulation layer 105 in the trench 122. The barrier layer is, for example, tantalum nitride (TaN), and the liner layer is, for example, ruthenium (Ru) or cobalt (Co).

The trench 122 is, for example, linear. The width L of the linear trench 122 is a magnitude of the trench 122 in a direction in which the trench 122 extends and in a direction perpendicular to a thickness direction T of the substrate W. All of the widths L of the plurality of trenches 122 are not necessarily the same, and trenches 122 respectively having at least two kinds of widths L are formed in the surface layer portion of the device surface of the substrate W. The width L is a width of the to-be-processed layer 102 and a width of the first oxide layer 103.

The width L of the trench 122 is, for example, not less than 20 nm and not more than 500 nm. The depth D of the trench 122 is a magnitude of the trench 122 in the thickness direction T, and is, for example, 200 nm or less.

The plurality of trenches 122 may be connected to each other. Additionally, the trench 122 is not necessarily required to be linear, and may be a minute opening (void or pore). If the trench 122 is a minute opening, the width L of the trench 122 is a diameter of the minute opening.

An example will be hereinafter described in which the to-be-processed layer 102 is a metal layer including a plurality of crystal grains 110 and in which the first oxide layer 103 is a metal oxide layer formed by oxidizing the to-be-processed layer 102. In that case, the first oxide layer 103 includes a plurality of crystal grains 110 in the same way as the to-be-processed layer 102. An interface between the crystal grains 110 is referred to as a grain boundary 111. The grain boundary 111 is a kind of lattice defect, and is formed by disorder in atomic arrangement.

The crystal grain 110 becomes slower in growth in proportion to narrowness of the width L of the trench 122, and becomes faster in growth in proportion to wideness of the width L of the trench 122. Therefore, it is possible to more easily make a small crystal grain 110 in proportion to narrowness of the width L of the trench 122, and it is possible to more easily make a large crystal grain 110 in proportion to wideness of the width L of the trench 122. In other words, the grain boundary density becomes higher in proportion to a decrease in the width L of the trench 122, and the grain boundary density becomes lower in proportion to an increase in the width L of the trench 122.

Figure 2A:
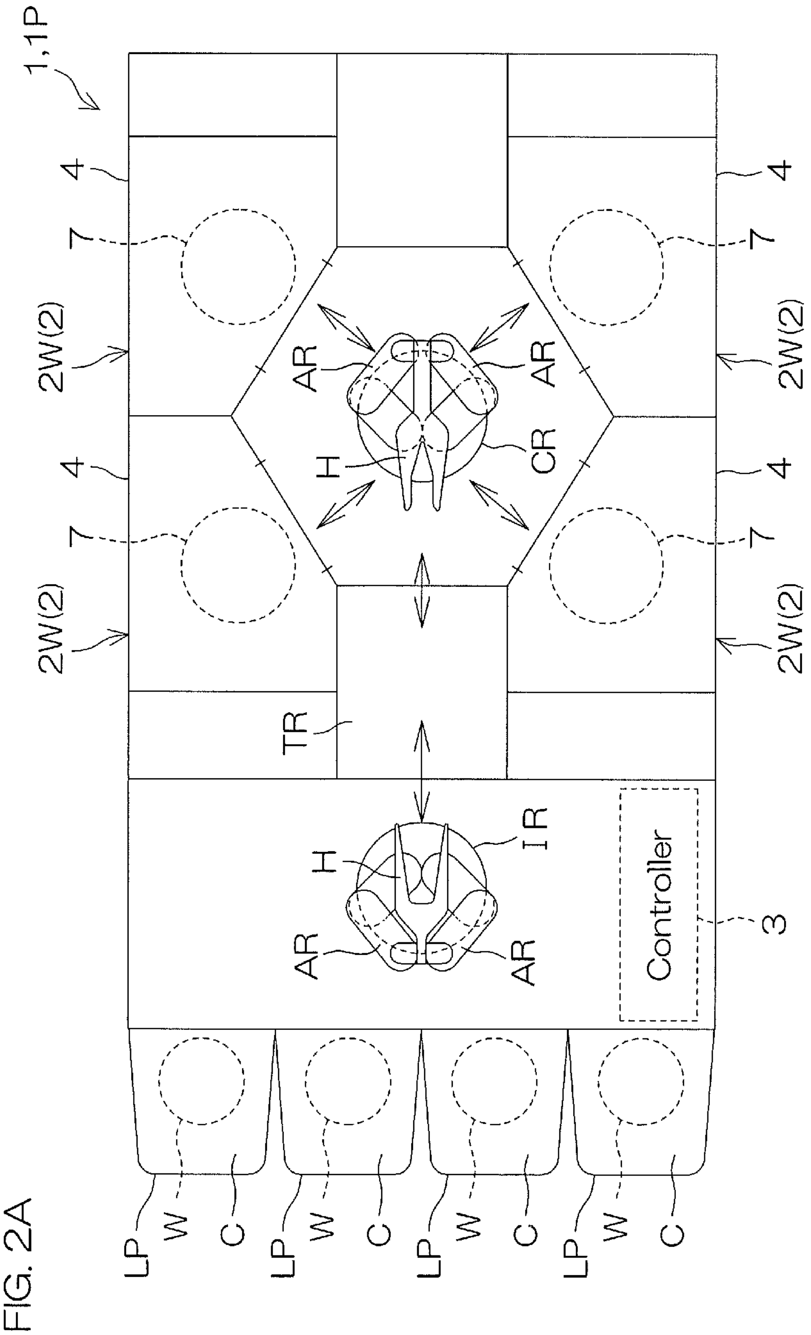
FIG. 2A is a plan view for describing a configuration of a substrate processing apparatus according to a first preferred embodiment of the present invention.
Figure 2B:
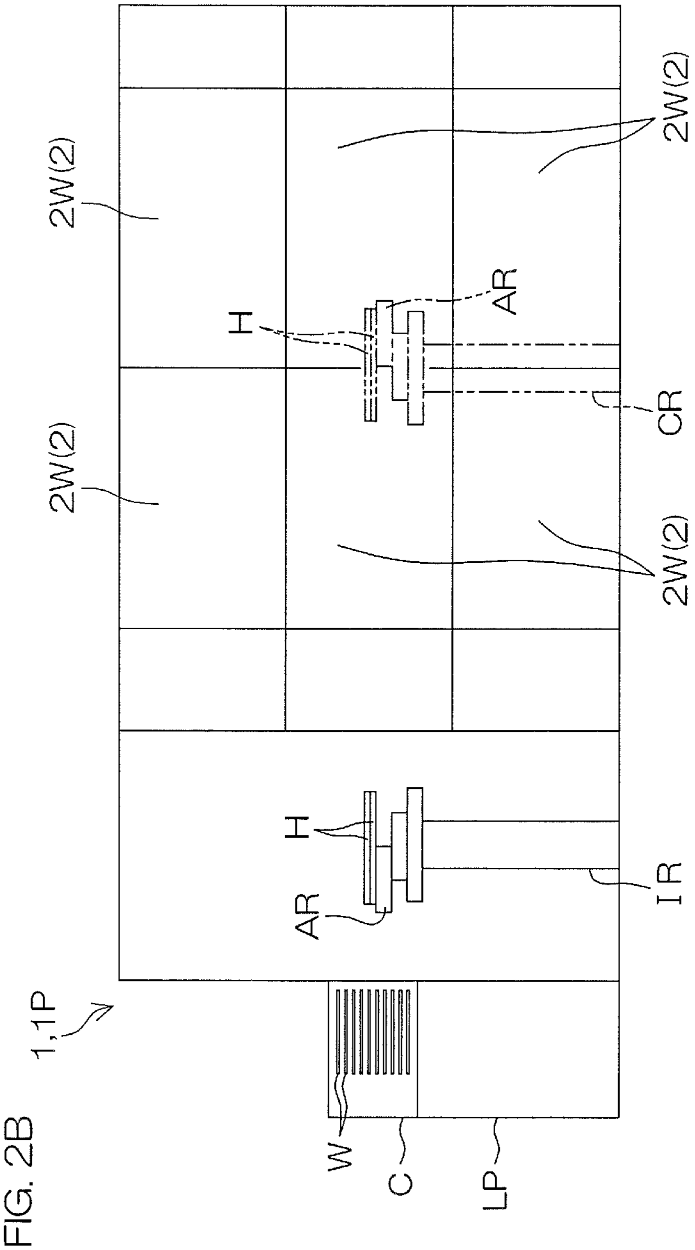
FIG. 2B is an elevational view for describing the configuration of the substrate processing apparatus.

Configuration of Substrate Processing Apparatus According to First Preferred Embodiment FIG. 2A is a plan view for describing a configuration of the substrate processing apparatus 1 according to a first preferred embodiment of the present invention. FIG. 2B is an elevational view for describing a configuration of the substrate processing apparatus 1.

The substrate processing apparatus 1 is a single substrate processing type apparatus that processes substrates W one by one. The substrate W is a disk-shaped substrate in the preferred embodiment. The substrate W is processed in an attitude in which a device surface is directed upwardly in the preferred embodiment.

The substrate processing apparatus 1 includes a plurality of processing units 2 each of which processes a substrate W, a load port LP in which a carrier C that houses a plurality of substrates W to be processed by the processing unit 2 is placed, transfer robots IR and CR both of which transfer a substrate W between the load port LP and the processing unit 2, and a controller 3 that controls the substrate processing apparatus 1.

The transfer robot IR transfers a substrate W between the carrier C and the transfer robot CR. The transfer robot CR transfers a substrate W between the transfer robot IR and the processing unit 2.

Each of the transfer robots IR and CR is, for example, an articulated-arm robot including a pair of articulated arms AR and a pair of hands H respectively provided at front ends of the pair of articulated arms AR so as to recede from each other upwardly and downwardly.

The plurality of processing units 2 respectively form four processing towers disposed at four positions distant horizontally. Each of the processing towers includes the plurality of processing units 2 stacked together in the up-down direction (in the preferred embodiment, three processing units) (see FIG. 2B). The four processing towers are disposed two by two on both sides of a transfer path TR that extends from the load port LP toward the transfer robots IR, CR (see FIG. 2A).

In the first preferred embodiment, the processing unit 2 is a wet processing unit 2W that processes a substrate W with a liquid. Each of the wet processing units 2W includes a chamber 4 and a processing cup 7 disposed in the chamber 4, and performs a processing operation for a substrate W in the processing cup 7.

The chamber 4 has an entrance/exit (not shown) through which a substrate W is carried in or is carried out by the transfer robot CR. The chamber 4 is provided with a shutter unit (not shown) that opens and closes this entrance/exit.

Figure 3:
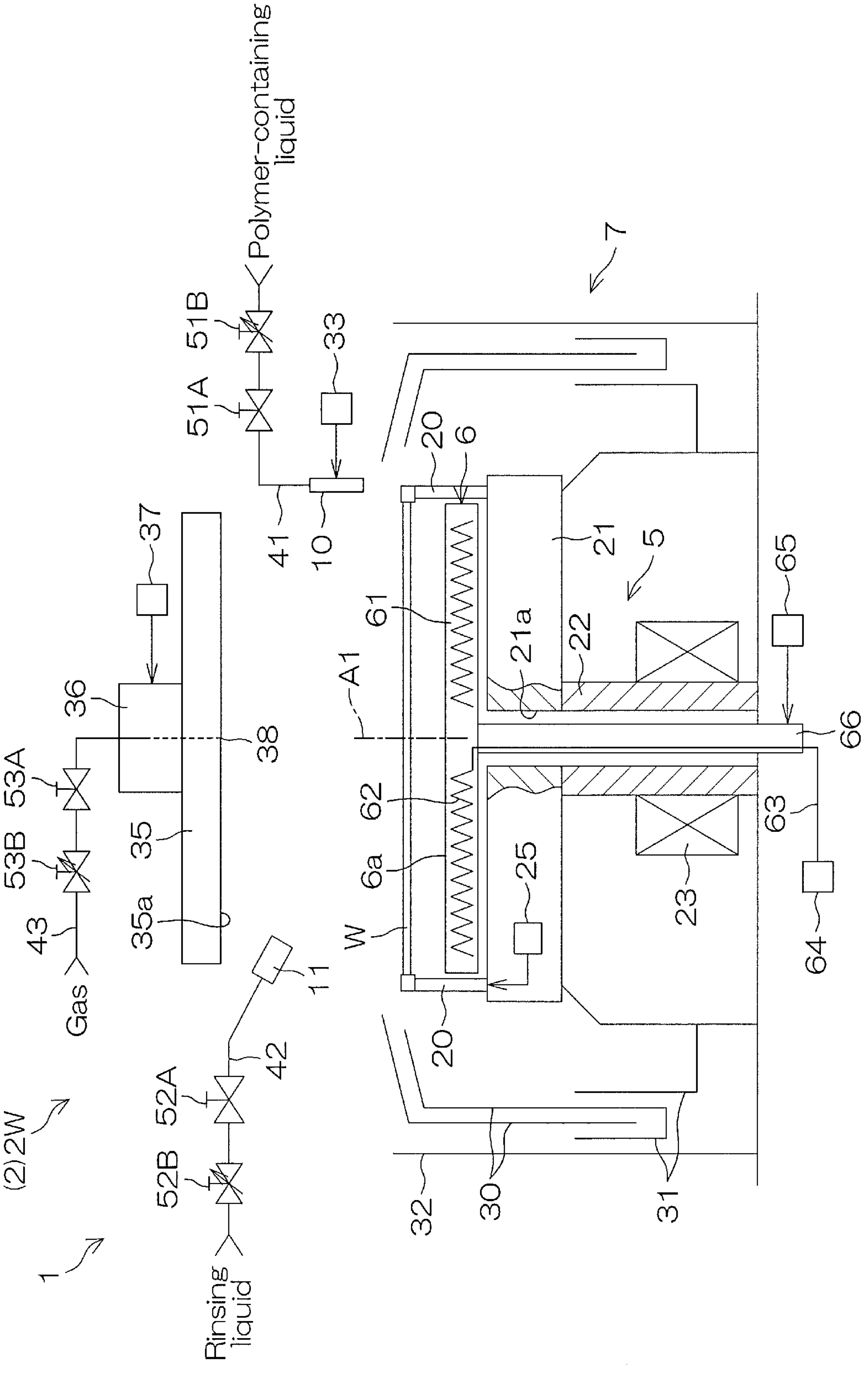
FIG. 3 is a schematic cross-sectional view for describing a configuration example of a wet processing unit included in the substrate processing apparatus.

FIG. 3 is a schematic cross-sectional view for describing a configuration example of the wet processing unit 2W.

The wet processing unit 2W additionally includes a spin chuck 5 that rotates a substrate W around a rotational axis A1 (vertical axis) while holding the substrate W at a predetermined holding position and a heater unit 6 that heats the substrate W held by the spin chuck 5. The rotational axis A1 is a vertical straight line that passes through a central portion of the substrate W. The holding position is a position of the substrate W shown in FIG. 3, and is a position at which the substrate W is held in a horizontal attitude.

The spin chuck 5 includes a spin base 21 that has a disk shape along a horizontal direction, a plurality of chuck pins 20 that grip a substrate W above the spin base 21 and that hold the substrate W at the holding position, a rotational shaft 22 an upper end of which is connected to the spin base 21 and that extends in the vertical direction, and a spin motor 23 that rotates the rotational shaft 22 around its central axis (rotational axis A1).

The plurality of chuck pins 20 are disposed at a distance from each other in a circumferential direction of the spin base 21 on an upper surface of the spin base 21. The spin motor 23 is an electric motor. The spin motor 23 rotates the rotational shaft 22, and, as a result, allows the spin base 21 and the plurality of chuck pins 20 to rotate around the rotational axis A1. Thereby, the substrate W is rotated around the rotational axis A1 together with the spin base 21 and the plurality of chuck pins 20.

The plurality of chuck pins 20 are movable between a closed position at which the chuck pins 20 grip the substrate W while being in contact with a peripheral edge portion of the substrate W and an open position to which the chuck pins 20 recede from the peripheral edge portion of the substrate W. The plurality of chuck pins 20 are moved by an opening-closing unit 25. The plurality of chuck pins 20 horizontally hold (clamp) the substrate W when the chuck pins 20 are placed at the closed position. When placed at the open position, the plurality of chuck pins 20 release the grip of the peripheral edge portion of the substrate W while coming into contact with a peripheral edge portion of a lower surface (major surface on the lower side) of the substrate W and supporting the substrate W from below.

The opening-closing unit 25 includes, for example, a link mechanism that moves the plurality of chuck pins 20 and a driving source that gives a driving force to the link mechanism. The driving source includes, for example, an electric motor.

The heater unit 6 is an example of a substrate heating unit that heats the entirety of the substrate W. The heater unit 6 has a form of a disk-shaped hot plate. The heater unit 6 is disposed between the upper surface of the spin base 21 and the lower surface of the substrate W. The heater unit 6 has a heating surface 6*a* that faces the lower surface of the substrate W from below.

The heater unit 6 includes a plate main body 61 and a heater 62. The plate main body 61 is slightly smaller than the substrate W in a plan view. An upper surface of the plate main body 61 forms the heating surface 6*a*. The heater 62 may be a resistive element built into the plate main body 61. The heating surface 6*a* is heated by energizing the heater 62. The heater 62 can heat the substrate W to a temperature substantially equal to the temperature of the heater 62. The heater 62 is configured to be able to heat the substrate W within a temperature range of not less than a normal temperature (for example, not less than 5° C. and not more than 25° C.) and not more than 400° C.

An elevation shaft 66 that is inserted in a through-hole 21*a* formed in a central portion of the spin base 21 and that is inserted in a hollow rotational shaft 22 is connected to a lower surface of the heater unit 6. An energizing unit 64, such as a power source, is connected to the heater 62 through an electric supply line 63, and an electric current supplied from the energizing unit 64 is adjusted, and, as a result, the temperature of the heater 62 is changed to a temperature within the above-described temperature range.

The heater unit 6 is raised and lowered by a heater elevation driving mechanism 65. The heater elevation driving mechanism 65 includes an electric motor or an actuator (not shown), such as an air cylinder, that drives and raises or lowers the elevation shaft 66. The heater elevation driving mechanism 65 raises and lowers the heater unit 6 through the elevation shaft 66. The heater unit 6 can be raised and lowered between the lower surface of the substrate W and the upper surface of the spin base 21.

When rising, the heater unit 6 is capable of receiving the substrate W from the plurality of chuck pins 20 placed at the open position. The heater unit 6 is capable of heating the substrate W by being placed at a contact position at which the heating surface 6*a* comes into contact with the lower surface of the substrate W or at a proximal position at which the heating surface 6*a* approaches the lower surface of the substrate W in a non-contact state. A position to which the heater unit 6 sufficiently recedes from the lower surface of the substrate W to such a degree that the heater unit 6 stops heating the substrate W is referred to as a retreat position.

A shut-off plate 35 that shuts off an atmosphere in a space between the shut-off plate 35 and the upper surface (upper major surface) of the substrate W held by the spin chuck 5 from an atmosphere outside this space is provided on the side higher than the spin base 21.

The shut-off plate 35 has a facing surface 35*a* that faces the upper surface of the substrate W held by the spin chuck 5 from above. The shut-off plate 35 is formed in a disk shape having a diameter substantially equal to or more than the substrate W. A support shaft 36 is fixed on the side opposite to the facing surface 35*a* in the shut-off plate 35.

The shut-off plate 35 is connected to a shut-off-plate elevation mechanism 37 that raises and lowers the shut-off plate 35. The shut-off-plate elevation mechanism 37 include, for example, an electric motor or an actuator (not shown), such as an air cylinder, that drives and raises or lowers the support shaft 36. The shut-off plate 35 may be rotatable around the rotational axis A1.

A gas discharge port 38 that discharges a gas, such as nitrogen gas, is provided in the facing surface 35*a*. The gas discharged from the gas discharge port 38 is not limited to a nitrogen gas. The gas discharged from the gas discharge port 38 may be air. Additionally, the gas discharged from the gas discharge port 38 may be an inert gas other than the nitrogen gas. The inert gas is not limited to a nitrogen gas, and is an inert gas that is inert with respect to the upper surface of the substrate W. Rare gasses, such as argon, can be mentioned as an example of the inert gas, besides the nitrogen gas.

A gas pipe 43 that guides a gas to the gas discharge port 38 is connected to the gas discharge port 38. A gas valve 53A that opens and closes a flow path in the gas pipe 43 and a gas flow-rate adjusting valve 53B that adjusts the flow rate of a gas in this flow path are interposed in the gas pipe 43. When the gas valve 53A is opened, a gas is discharged from the gas discharge port 38 toward the upper surface of the substrate W at a flow rate according to the opening degree of the gas flow-rate adjusting valve 53B.

The processing cup 7 receives a liquid scattering from the substrate W held by the spin chuck 5. The processing cup 7 includes a plurality of (in the example of FIG. 3, two) guards 30 that catch a liquid that scatters outwardly from the substrate W held by the spin chuck 5, a plurality of (in the example of FIG. 3, two) cups 31 that catch a liquid that is downwardly guided by the plurality of guards 30, and a circular-cylindrical outer-wall member 32 that surrounds the plurality of guards 30 and the plurality of cups 31. The plurality of guards 30 are individually raised and lowered by a guard elevation driving mechanism (not shown). The guard elevation driving mechanism places the guard 30 at an arbitrary position from the upper position to the lower position.

The wet processing unit 2W additionally includes a polymer-containing liquid nozzle 10 that supplies a polymer-containing liquid that contains an acid polymer to the upper surface of the substrate W held by the spin chuck 5 and a rinsing-liquid nozzle 11 that supplies a rinsing liquid, such as DIW (Deionized Water), to the upper surface of the substrate W held by the spin chuck 5.

The polymer-containing liquid contains a solute and a solvent that dissolves the solute. The solute of the polymer-containing liquid includes an acid polymer, an alkaline component, and an electroconductive polymer.

The acid polymer is an acid polymer that dissolves an oxide layer without oxidizing a to-be-processed layer. The acid polymer is solid at a normal temperature, and releases protons into the solvent, and exhibits acidity.

The molecular weight of the acid polymer is, for example, not less than 1000 and not more than 100000. The acid polymer is not limited to polyacrylic acid. The acid polymer is, for example, a carboxyl-containing polymer, a sulfo-containing polymer, or a mixture of these polymers. The carboxylic polymer is, for example, polyacrylic acid, carboxy vinyl polymer (carbomer), carboxymethylcellulose, or a mixture of these substances. The sulfo-containing polymer is, for example, polystyrene sulfonic acid, polyvinyl sulfonic acid, or a mixture of these substances.

It is desirable for a solvent contained in the polymer-containing liquid to be a liquid at a normal temperature, to be capable of dissolving or swelling an acid polymer, and to be evaporated by rotating or heating the substrate W. The solvent contained in the polymer-containing liquid is not limited to DIW, and is, preferably, a water-based solvent. The solvent contains at least one among DIW, carbonic water, electrolyzed ion water, hydrochloric acid water having a diluted concentration (for example, not less than 1 ppm and not more than 100 ppm), ammonia water having a diluted concentration (for example, not less than 1 ppm and not more than 100 ppm), and restoration water (hydrogenated water).

The alkaline component is, for example, ammonia. The alkaline component is not limited to ammonia. In detail, the alkaline component includes, for example, ammonia, tetramethylammonium hydroxide (TMAH), dimethylamine, or a mixture of these substances. Preferably, the alkaline component is a component that is evaporated by being heated at temperature less than the boiling point of the solvent and that exhibits alkalinity in the solvent. Particularly preferably, the alkaline component is ammonia, which is a gas at a normal temperature, or is dimethylamine and a mixture of these substances.

The electroconductive polymer is not limited to polyacetylene. The electroconductive polymer is a conjugated polymer having a conjugated double bond. The conjugated polymer is, for example, an aliphatic conjugated polymer such as polyacetylene, an aromatic conjugated polymer such as poly (p-phenylene), a mixed conjugated polymer such as poly (p-phenylene vinylene), a heterocyclic conjugated polymer such as polypyrrole, polythiophene, and poly (3, 4-ethylene dioxythiophene) (PEDOT), a heteroatom-containing conjugated polymer such as polyaniline, a plural-chain conjugated polymer such as polyacene, a two-dimensional conjugated polymer such as graphene, or a mixture of these substances.

The polymer-containing liquid nozzle 10 is a movable nozzle that is movable at least in the horizontal direction. The polymer-containing liquid nozzle 10 is moved in the horizontal direction by means of a first nozzle moving unit 33. The first nozzle moving unit 33 includes an arm (not shown) that is united with the polymer-containing liquid nozzle 10 and that extends horizontally and an arm moving unit that moves the arm in the horizontal direction. The arm moving unit may be an electric motor or an air cylinder, or may be an actuator other than these devices.

The polymer-containing liquid nozzle 10 may be movable in the vertical direction. The polymer-containing liquid nozzle 10 is capable of approaching the upper surface of the substrate W and receding upwardly from the upper surface of the substrate W by moving in the vertical direction. Unlike the preferred embodiment, the polymer-containing liquid nozzle 10 may be a stationary nozzle whose horizontal and vertical positions are fixed.

The polymer-containing liquid nozzle 10 is connected to an end of a polymer-containing liquid pipe 41 that guides a polymer-containing liquid to the polymer-containing liquid nozzle 10. The other end of the polymer-containing liquid pipe 41 is connected to a polymer-containing liquid tank (not shown). A polymer-containing liquid valve 51A that opens and closes a flow path in the polymer-containing liquid pipe 41 and a polymer-containing liquid flow-rate adjusting valve 51B that adjusts the flow rate of a polymer-containing liquid in this flow path are interposed in the polymer-containing liquid pipe 41.

When the polymer-containing liquid valve 51A is opened, a polymer-containing liquid is discharged downwardly from a discharge port of the polymer-containing liquid nozzle 10 in a continuous flow at a flow rate according to the opening degree of the polymer-containing liquid flow-rate adjusting valve 51B.

At least a portion of the solvent is evaporated from a polymer-containing liquid supplied to the upper surface of the substrate W, and, as a result, the polymer-containing liquid on the substrate W changes into a semisolid or solid polymer film. The term "semisolid" denotes a state in which a solid constituent and a liquid constituent are mixed together or a state in which the film is enabled to have such a viscosity as to keep a predetermined shape on the substrate W. The term "solid" denotes a state in which the film does not contain a liquid constituent, and is made of only a solid constituent. The polymer film in which the solvent remains is semisolid, and the polymer film in which the solvent has been completely eliminated is solid.

An alkaline component and an electroconductive polymer, in addition to an acid polymer, are contained in the polymer-containing liquid as a solute. Therefore, an acid polymer, an alkaline component, and an electroconductive polymer are contained in the polymer film.

The polymer film is neutral in a state in which an alkaline component and an acid polymer are contained in the polymer film. In other words, the acid polymer is neutralized by the alkaline component, and is substantially deactivated. Therefore, the oxide layer of the substrate W is hardly dissolved by the action of the acid polymer. If the polymer film is heated, and the alkaline component is evaporated from the polymer film, the acid polymer will regain activity. In other words, the oxide layer of the substrate W is dissolved by the action of the acid polymer.

Preferably, the solvent remains in the polymer film without being completely evaporated. If so, the acid polymer in the polymer film can sufficiently function as an acid, thereby making it possible to efficiently remove the oxide layer. If the solvent remains, the polymer film exhibits neutrality when the alkaline component exists in the polymer film, and the polymer film exhibits acidity after the alkaline component is evaporated.

The electroconductive polymer functions as a medium for allowing the acid polymer to release protons (hydrogen ions) in the same way as the solvent. Therefore, it is possible to ionize the acid polymer and to allow the acid polymer to act on the oxide layer even if the solvent has been completely eliminated from the polymer film.

Additionally, it is possible to increase the concentration of the acid polymer component that has been dissolved into the solvent in the polymer film by moderately evaporating the solvent in the polymer film. This makes it possible to efficiently remove the first oxide layer. Additionally, the chemical reaction to remove (dissolve) the oxide layer by means of the acid polymer is facilitated in proportion to an increase in temperature of the polymer film. In other words, the acid polymer has a property according to which the removal rate of the oxide layer becomes higher in proportion to an increase in temperature. Therefore, it is possible to efficiently remove the first oxide layer by heating the polymer film formed on the upper surface of the substrate W.

The rinsing-liquid nozzle 11 is an example of a rinsing liquid supply unit that supplies a rinsing liquid to the major surface of the substrate W. The rinsing liquid functions as a polymer removing liquid (first polymer removing liquid) that dissolves a polymer film formed on the upper surface of the substrate W and then removes the polymer film from the major surface of the substrate W, and the rinsing-liquid nozzle 11 functions as a removing-liquid supply unit.

The rinsing liquid is not limited to DIW. The rinsing liquid contains at least one among DIW, carbonic water, electrolyzed ion water, hydrochloric acid water having a diluted concentration (for example, not less than 1 ppm and not more than 100 ppm), ammonia water having a diluted concentration (for example, not less than 1 ppm and not more than 100 ppm), and restoration water (hydrogenated water). In other words, a liquid that is the same as the solvent of the polymer-containing liquid can be used as the rinsing liquid, and, if DIW is used both as the rinsing liquid and as the solvent of the polymer-containing liquid, the kind of liquids (substances) used here can be reduced.

The rinsing-liquid nozzle 11 is a stationary nozzle whose horizontal and vertical positions are fixed in the preferred embodiment. Unlike the preferred embodiment, the rinsing-liquid nozzle 11 may be a movable nozzle that is movable at least in the horizontal direction.

The rinsing-liquid nozzle 11 is connected to an end of a rinsing-liquid pipe 42 that guides a rinsing liquid to the rinsing-liquid nozzle 11. The other end of the rinsing-liquid pipe 42 is connected to a rinsing liquid tank (not shown). A rinsing-liquid valve 52A that opens and closes a flow path in the rinsing-liquid pipe 42 and a rinsing liquid flow-rate adjusting valve 52B that adjusts the flow rate of a rinsing liquid in this flow path are interposed in the rinsing-liquid pipe 42. When the rinsing-liquid valve 52A is opened, the rinsing liquid discharged from the discharge port of the rinsing-liquid nozzle 11 in a continuous flow lands on the upper surface of the substrate W.

Figure 4:
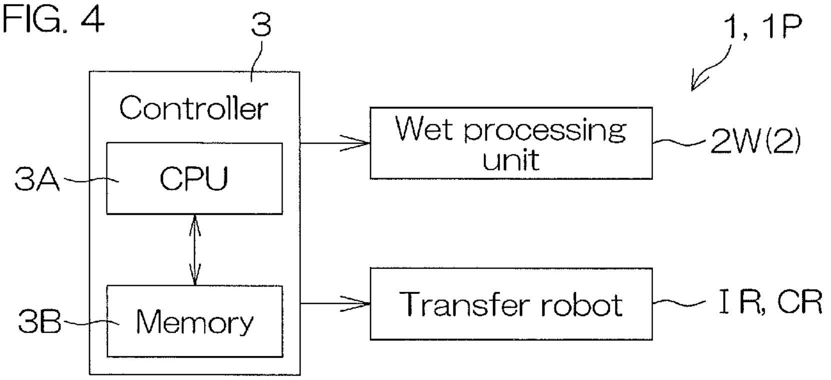
FIG. 4 is a block diagram for describing a configuration example concerning the control of the substrate processing apparatus.

FIG. 4 is a block diagram for describing a configuration example concerning the control of the substrate processing apparatus 1. The controller 3 is provided with a microcomputer, and controls a to-be-controlled component provided in the substrate processing apparatus 1 in accordance with a predetermined control program. In detail, the controller 3 includes a processor (CPU) 3A and a memory 3B in which the control program is stored. The controller 3 is configured to perform a variety of control processes for substrate processing by allowing the processor 3A to execute the control program.

Particularly, the controller 3 is programmed to control each member (valve, motor, power source, etc.) of which the processing unit 2 is composed, the transfer robots IR and CR, etc. Valves are controlled by the controller 3, and, as a result, the presence or absence of the discharge of a fluid from a corresponding nozzle or the flow amount of a fluid discharged from a corresponding nozzle is controlled. The following steps are performed by allowing the controller 3 to control these constituents. In other words, the controller 3 is programmed to perform the following steps.

Substrate Processing According to First Preferred Embodiment

Figure 5:
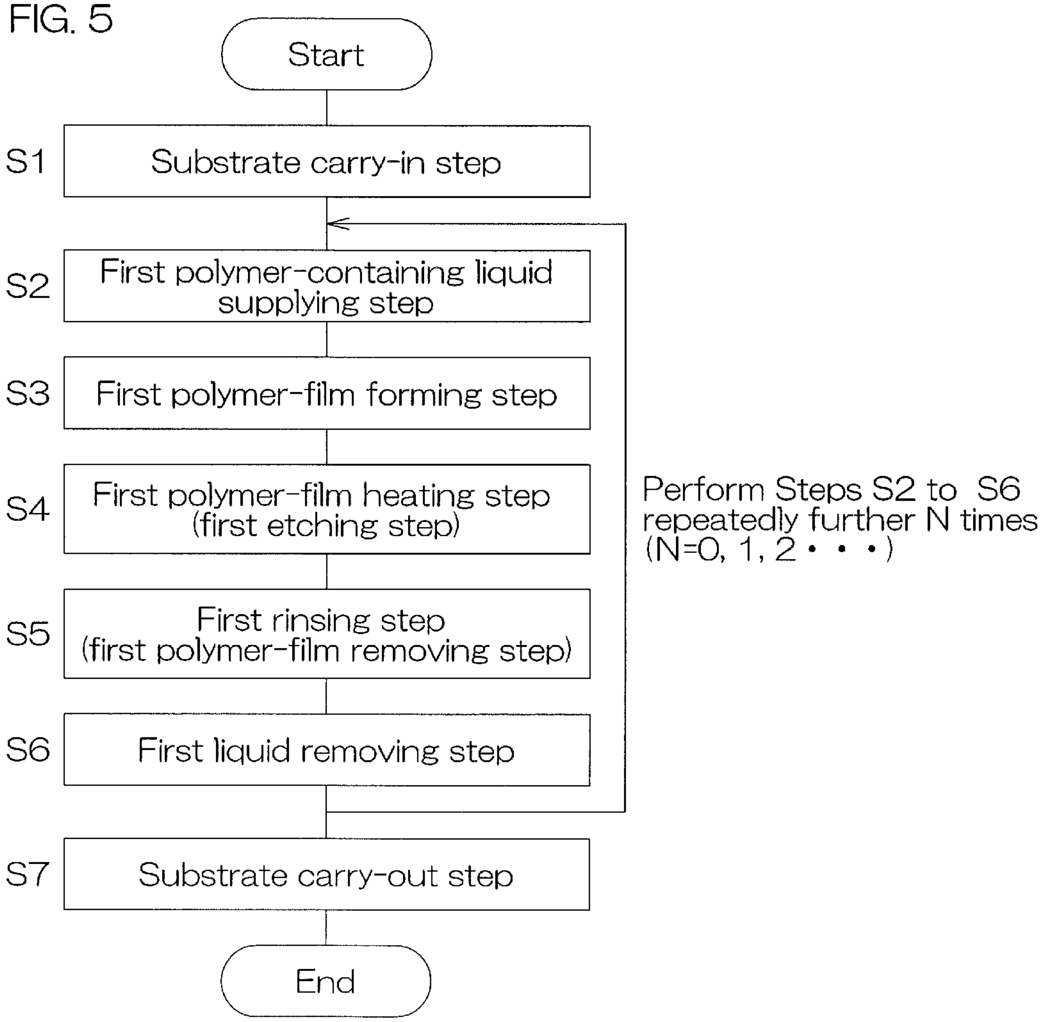
FIG. 5 is a flowchart for describing an example of substrate processing performed by the substrate processing apparatus.

FIG. 5 is a flowchart for describing an example of substrate processing performed by the substrate processing apparatus 1. FIG. 6A to FIG. 6F are schematic views for describing an aspect of each step of substrate processing performed by the substrate processing apparatus 1.

Substrate processing performed by the substrate processing apparatus 1 will be hereinafter described with reference mainly to FIG. 3 and FIG. 5. Reference is made to FIG. 6A to FIG. 6F where appropriate.

First, a substrate W having a major surface from which a first oxide layer is exposed is prepared (substrate preparation step). In detail, the carrier C in which the substrate W having the major surface from which the first oxide layer is exposed is housed is placed on the load port LP.

The substrate W is carried from the carrier C into the wet processing unit 2W by means of the transfer robots IR and CR (see FIG. 2A), and is delivered to the plurality of chuck pins 20 of the spin chuck 5 (substrate carry-in step: Step S1). The opening-closing unit 25 moves the plurality of chuck pins 20 to the closed position, and, as a result, the substrate W is gripped by the plurality of chuck pins 20. Thereby, the substrate W is horizontally held by the spin chuck 5 (substrate holding step). The spin motor 23 starts rotating the substrate W in a state in which the substrate W is held by the spin chuck 5 (substrate rotating step).

Thereafter, the transfer robot CR recedes outwardly from the wet processing unit 2W, and then a first polymer-containing liquid supplying step (Step S2) of supplying a polymer-containing liquid to the upper surface of the substrate W is performed.

Figure 6A:
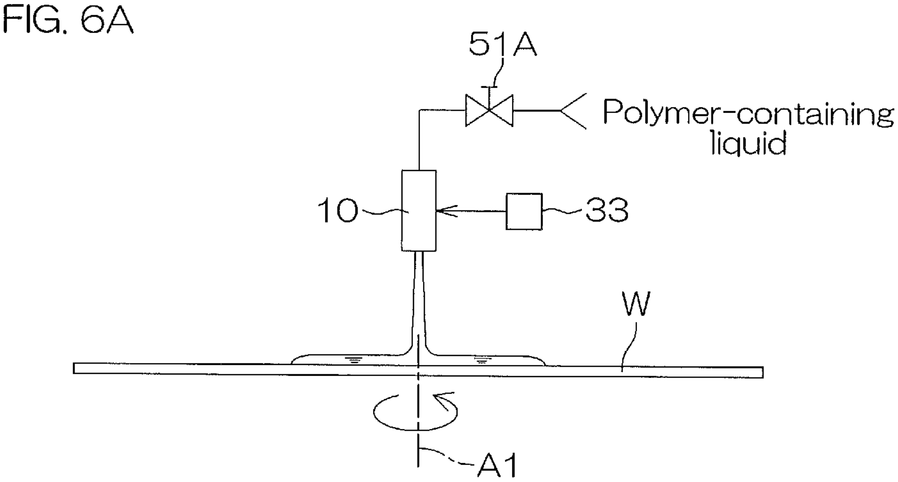
FIG. 6A is a schematic view for describing an aspect of a substrate when the substrate processing is performed.

In detail, the first nozzle moving unit 33 moves the polymer-containing liquid nozzle 10 to the processing position. The processing position of the polymer-containing liquid nozzle 10 is, for example, a central position at which the polymer-containing liquid nozzle 10 faces a central region of the upper surface of the substrate W. The central region of the upper surface of the substrate W is a region including a center position of the upper surface of the substrate W and the neighborhood of the center position. The polymer-containing liquid valve 51A is opened in a state in which the polymer-containing liquid nozzle 10 is placed at the processing position. The polymer-containing liquid valve 51A is opened, and, as a result, a polymer-containing liquid is discharged from the polymer-containing liquid nozzle 10 toward the central region of the upper surface of the substrate W as shown in FIG. 6A (polymer-containing liquid discharging step). The polymer-containing liquid discharged from the polymer-containing liquid nozzle 10 lands on the central region of the upper surface of the substrate W.

The substrate W may be rotated at a low speed (for example, 10 rpm) while the polymer-containing liquid is being supplied to the upper surface of the substrate W (low-speed rotation step). Alternatively, the rotation of the substrate W may be stopped while the polymer-containing liquid is being supplied to the upper surface of the substrate W. The polymer-containing liquid supplied to the substrate W stays at the central region of the upper surface of the substrate W by reducing the rotation speed of the substrate W to a low speed or by stopping the rotation of the substrate W. This makes it possible to reduce the amount of the polymer-containing liquid used.

Figure 6B:
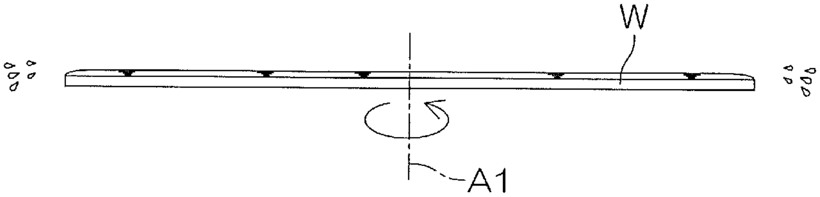
FIG. 6B is a schematic view for describing an aspect of the substrate when the substrate processing is performed.
Figure 6C:
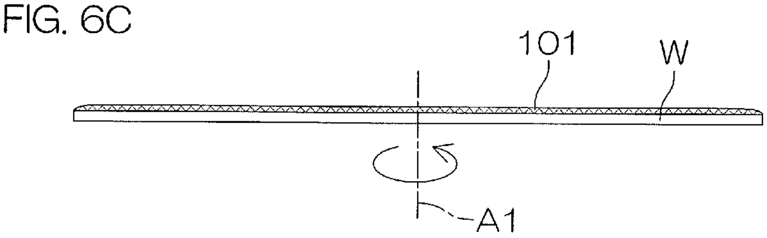
FIG. 6C is a schematic view for describing an aspect of the substrate when the substrate processing is performed.

Thereafter, at least a portion of the solvent contained in the polymer-containing liquid on the upper surface of the substrate W is evaporated as shown in FIG. 6B and FIG. 6C, and, as a result, a first polymer-film forming step (Step S3) of forming a solid or semisolid polymer film 101 (first polymer film) on the upper surface of the substrate W (see FIG. 6C) is performed. The acid polymer, the alkaline component, and the electroconductive polymer contained in the first polymer film are an example of a first acid polymer, an example of a first alkali component, and an example of a first electroconductive polymer, respectively.

In detail, the polymer-containing liquid valve 51A is closed, and the discharge of the polymer-containing liquid from the polymer-containing liquid nozzle 10 is stopped. The polymer-containing liquid valve 51A is closed, and then the polymer-containing liquid nozzle 10 is moved to the retreat position by means of the first nozzle moving unit 33. When the polymer-containing liquid nozzle 10 is moved to the retreat position, the polymer-containing liquid nozzle 10 does not face the upper surface of the substrate W, and is placed outside the processing cup 7 in a plan view.

The polymer-containing liquid valve 51A is closed, and then the rotation of the substrate W is accelerated so that the rotation speed of the substrate W reaches a predetermined spin-off speed as shown in FIG. 6B (rotation acceleration step). The spin-off speed is, for example, 1500 rpm. The rotation of the substrate W at the spin-off speed is continued during, for example, 30 seconds.

The polymer-containing liquid staying in the central region of the upper surface of the substrate W is expanded toward the peripheral edge portion of the upper surface of the substrate W by means of a centrifugal force caused by the rotation of the substrate W. Thereby, the polymer-containing liquid is expanded to the entirety of the upper surface of the substrate W. A portion of the polymer-containing liquid on the substrate W scatters from the peripheral edge portion of the substrate W outwardly from the substrate W, and the liquid film of the polymer-containing liquid on the substrate W is thinned as shown in FIG. 6B (spin-off step).

The polymer-containing liquid on the upper surface of the substrate W is not required to scatter outwardly from the substrate W, and is merely required to be spread to the entirety of the upper surface of the substrate W by means of the action of the centrifugal force of the rotation of the substrate W.

The centrifugal force caused by the rotation of the substrate W acts not only on the polymer-containing liquid on the substrate W but also on a gas contiguous to the polymer-containing liquid on the substrate W. Therefore, an airflow in which this gas proceeds toward the peripheral edge side from the central side of the upper surface of the substrate W is formed by the action of the centrifugal force. Because of this airflow, the solvent that is in a gaseous state and that is contiguous to the polymer-containing liquid on the substrate W is excluded from an atmosphere contiguous to the substrate W. Therefore, the evaporation (volatilization) of the solvent from the polymer-containing liquid on the substrate W is facilitated, and a solid or semisolid polymer film 101 is formed as shown in FIG. 6C (first polymer-film forming step). Thus, both the polymer-containing liquid nozzle 10 and the spin motor 23 function as a polymer-film forming unit.

The polymer film 101 is higher in viscosity than the polymer-containing liquid, and therefore the polymer film 101 stays on the substrate W without being completely excluded from on the substrate W although the substrate W is rotating. Immediately after forming the polymer film 101, an alkaline component is contained in the polymer film 101.

Therefore, the acid polymer in the polymer film 101 is in a deactivated state, and therefore the oxide layer is not removed.

Figure 6D:
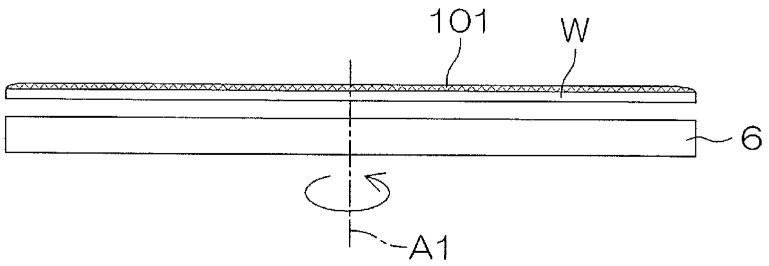
FIG. 6D is a schematic view for describing an aspect of the substrate when the substrate processing is performed.

A first polymer-film heating step (Step S4) of heating the polymer film 101 on the substrate W in a state in which the polymer film 101 is being formed on the upper surface of the substrate W is performed. In detail, the heater unit 6 is placed at the proximal position, and the substrate W is heated as shown in FIG. 6D (substrate heating step, heater heating step).

The polymer film 101 formed on the substrate W is heated through the substrate W. The polymer film 101 is heated, and, as a result, the alkaline component is evaporated, and the acid polymer regains activity (alkali component evaporation step, alkali component removing step) Therefore, the etching of the substrate W is started by the action of the acid polymer in the polymer film 101 (first etching start step, etching step).

In detail, the removal of the oxide layer formed at the surface layer portion of the upper surface of the substrate W is started (oxide layer removal start step, oxide layer removing step). Until the polymer film 101 is heated after the polymer film 101 is formed, the acid polymer is neutralized by the alkaline component, and is in a substantially deactivated state. Therefore, until the polymer film 101 is heated after the polymer film 101 is formed, the etching of the substrate W is hardly started.

The acid polymer has a property in which the removal rate of the first oxide layer becomes higher in proportion to an increase in temperature as described above. Therefore, even after the alkaline component is removed from the polymer film 101, the removal of the first oxide layer by means of the acid polymer is facilitated by continuously heating the polymer film 101 (first removal facilitating step). It is possible to reduce a period of time required for substrate processing by facilitating the removal of the first oxide layer. Unlike FIG. 6D, the heater unit 6 may be placed at the contact position in the first polymer-film heating step.

The polymer film 101 is heated, and, as a result, the solvent in the polymer film 101 is evaporated. Therefore, the concentration of the acid polymer that has been dissolved into the solvent in the polymer film 101 becomes higher (polymer concentrating step). Thereby, the concentration of the acid polymer rises, and the removal rate of the first oxide layer caused by the action of the acid polymer is improved.

Preferably, the heating temperature of the substrate W is lower than the boiling point of the solvent in the polymer film 101. If so, it is possible to moderately evaporate the solvent from the polymer film 101 on the substrate W. Therefore, it is possible to raise the concentration of the acid polymer that has been dissolved into the solvent in the polymer film 101. Additionally, it is possible to prevent the solvent from being thoroughly evaporated and from being completely removed from inside of the polymer film 101.

Figure 6E:
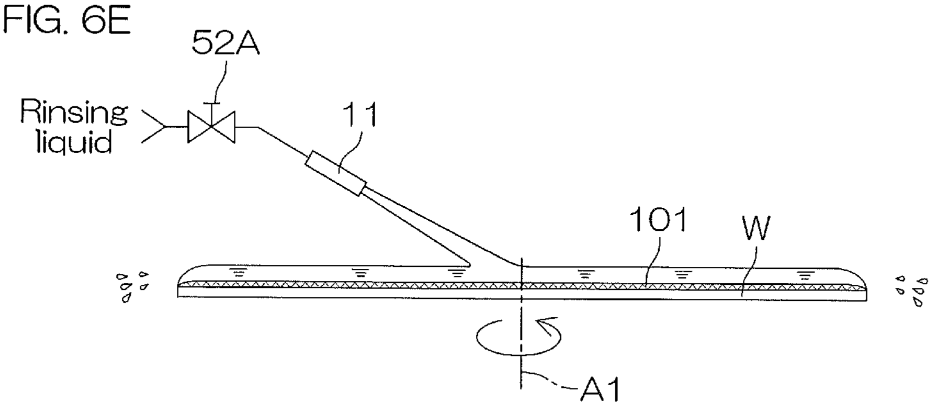
FIG. 6E is a schematic view for describing an aspect of the substrate when the substrate processing is performed.

Thereafter, the polymer film 101 is heated through the substrate W during a predetermined period of time, and then a first polymer-film removing step (Step S5) of removing the polymer film 101 on the substrate W is performed. In detail, the heater unit 6 recedes to the retreat position, and the rinsing-liquid valve 52A is opened. The rinsing-liquid valve 52A is opened, and, as a result, a rinsing liquid is supplied (discharged) from the rinsing-liquid nozzle 11 toward the central region of the upper surface of the substrate W on which the polymer film 101 is formed as shown in FIG. 6E (rinsing liquid supplying step, rinsing liquid discharging step). The rinsing liquid discharged from the rinsing-liquid nozzle 11 lands on the central region of the upper surface of the substrate W.

The substrate W is rotated at a predetermined rinsing speed (for example, 800 rpm) while supplying a rinsing liquid to the upper surface of the substrate W.

The rinsing liquid that has landed on the central region of the upper surface of the substrate W, which is rotating, spreads from the central region of the substrate W toward the peripheral edge side. The polymer film 101 on the substrate W is dissolved by the rinsing liquid that has landed on the upper surface of the substrate W (first polymer film dissolving step). The rinsing liquid is continuously supplied to the substrate W, and, as a result, the polymer film 101 is removed from on the upper surface of the substrate W (first polymer-film removing step). The polymer film 101 is removed from the upper surface of the substrate W both by the dissolving action made by the rinsing liquid and by the flow of the rinsing liquid created on the upper surface of the substrate W. As thus described, the major surface of the substrate W is washed by the rinsing liquid (first rinsing liquid) (first rinsing step).

The rinsing liquid is supplied during a predetermined period of time, and then a first liquid removing step (Step S6) of removing the rinsing liquid on the upper surface of the substrate W from the upper surface of the substrate W is performed.

Figure 6F:
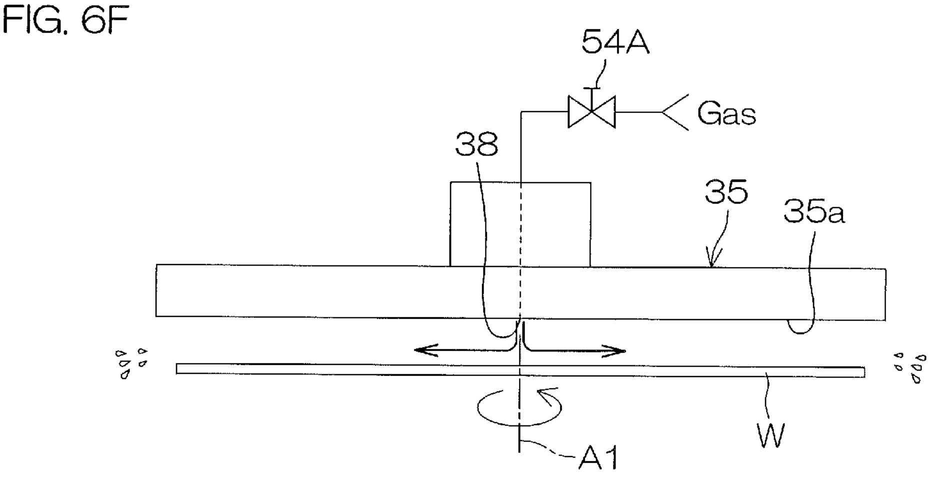
FIG. 6F is a schematic view for describing an aspect of the substrate when the substrate processing is performed.

In detail, the rinsing-liquid valve 52A is closed, and the supply of the rinsing liquid to the upper surface of the substrate W is stopped. Thereafter, the spin motor 23 accelerates the rotation of the substrate W, and rotates the substrate W at a high speed. The substrate W is rotated at a predetermined drying speed, for example, at 1500 rpm. As a result, a great centrifugal force acts on the rinsing liquid on the substrate W, and the rinsing liquid on the substrate W is shaken off toward the neighborhood of the substrate W as shown in FIG. 6F. Thereby, the upper surface of the substrate W is dried (drying step).

When the rinsing liquid is removed from the upper surface of the substrate W, a gas may be discharged from the gas discharge port 38 formed in the facing surface 35*a* of the shut-off plate 35 toward the central region of the upper surface of the substrate W (gas discharging step). The gas that has collided with the upper surface of the substrate W forms an airflow that spreads from the central region of the substrate W toward the peripheral edge side along the upper surface of the substrate W. This airflow makes it possible to facilitate the removal of the rinsing liquid on the substrate W.

The first oxide layer may be additionally removed by again forming the polymer film 101 on the upper surface of the substrate W after removing the rinsing liquid from on the upper surface of the substrate W. In other words, after the first polymer-film removing step (strictly, the first liquid removing step) is performed, the first polymer-film forming step (first etching step) and the first polymer-film removing step (first rinsing step) may be each performed at least once more in this order. Still in other words, cycle processing (which is hereinafter referred to as “first cycle processing” if necessary) in which a process ranging from the first polymer-containing liquid supplying step (Step S2) to the first liquid removing step (Step S6) is defined as “one cycle” may be performed twice or more.

“N” in FIG. 5 denotes an integer equal to or more than 0. If “N” is 0, the steps of from the first polymer-containing liquid supplying step (Step S2) to the first liquid removing step (Step S6) are each performed once, and, if “N” is 1 or more, the steps of from the first polymer-containing liquid supplying step (Step S2) to the first liquid removing step (Step S6) are each performed twice or more. In other words, if "N" is 1 or more, the first cycle processing is performed a plurality of times.

For example, if a desired amount of the first oxide layer can be removed by performing the first etching step once, the first cycle processing is not required to be performed, and it is recommended to perform each of the steps of from the first polymer-containing liquid supplying step (Step S2) to the first liquid removing step (Step S6) once. On the contrary, if a desired amount of the first oxide layer cannot be removed by performing the first etching step once, it is preferable to perform the first cycle processing. The first oxide layer is removed from the upper surface of the substrate W, and the to-be-processed layer is exposed by performing the formation and the removal of the polymer film 101 once or more.

If "N" is 1 or more, the first polymer-film forming step (first oxide layer removing step) and the first polymer-film removing step are alternately repeated. In other words, the first polymer-film forming step (first oxide layer removing step) and the first polymer-film removing step are each alternately performed a plurality of times. The first oxide layer 103 can be sufficiently etched by performing the formation and the removal of the polymer film 101 a plurality of times even if a desired amount of the first oxide layer 103 is not etched by performing the formation and the removal of the polymer film 101 once. For example, the first oxide layer 103 may be thoroughly removed from the substrate W by performing the formation and the removal of the polymer film 101 a plurality of times.

Subsequent to the last first liquid removing step (Step S6), the spin motor 23 stops the rotation of the substrate W. The transfer robot CR enters the wet processing unit 2W, and receives an already-processed substrate W from the plurality of chuck pins 20, and carries this substrate W out of the wet processing unit 2W (substrate carry-out step: Step S7). This substrate W is delivered from the transfer robot CR to the transfer robot IR, and is housed in the carrier C by means of the transfer robot IR.

According to the first preferred embodiment, at least a portion of the first oxide layer 103 is removed from the substrate W by means of an acid polymer in the polymer film 101 formed on the upper surface of the substrate W. Thereafter, the upper surface of the substrate W is washed by the first rinsing liquid, and therefore the polymer film 101 is removed from the upper surface of the substrate W. Therefore, it is possible to start the etching of the substrate W by means of the formation of the polymer film 101, and is possible to remove the polymer film 101 from the upper surface of the substrate W, and is possible to stop the etching of the substrate W. Therefore, it is possible to adjust an amount of etching applied to the first oxide layer 103 by means of the formation and the removal of the polymer film 101, thereby making it possible to excellently etch the substrate W.

The polymer film 101 used to remove the first oxide layer 103 is semisolid or solid, and hence stays on the upper surface of the substrate W more easily than a liquid. Therefore, there is no need to continuously supply an acid-polymer-containing liquid to the upper surface of the substrate W during an entire period of time during which the first oxide layer 103 is removed. In other words, at least after forming the polymer film 101, there is no need to additionally supply an acid-polymer-containing liquid to the upper surface of the substrate W. Therefore, the acid polymer that is a substance required to etch the substrate W is enabled to be reduced in amount used. As a result, a substance used to etch a substrate is enabled to be reduced in amount used.

Additionally, according to the first preferred embodiment, the rinsing liquid is removed from the upper surface of the substrate W after the polymer film 101 is removed by the rinsing liquid and before the polymer film 101 is newly formed. Therefore, it is possible to prevent the polymer film 101, which is being formed, from being removed by the rinsing liquid remaining on the upper surface of the substrate W. This enables the polymer film 101 to sufficiently exhibit the etching action upon the substrate W, thereby making it possible to increase the amount of etching applied to the substrate W by forming the polymer film once. As a result, it is possible to make a substance required to etch the substrate W even smaller in amount used, thereby making it possible to reduce an environmental load.

Additionally, according to the first preferred embodiment, it is possible to form the polymer film 101 by evaporating a solvent from a polymer-containing liquid supplied to the upper surface of the substrate W. Therefore, it is possible to raise the concentration of an acid polymer included in the polymer film 101 by evaporating the solvent. Therefore, a high-concentrated acid polymer is enabled to act on the first oxide layer 103. Therefore, it is possible to swiftly etch the substrate W.

Additionally, according to the first preferred embodiment, the acid polymer is a carboxyl-containing polymer, a sulfo-containing polymer, a hydroxyl-containing polymer, or a mixture of these polymers. Therefore, it is possible to use water, such as DIW, as a liquid that dissolves an acid polymer. Therefore, there is no need to use an organic solvent as a solvent that dissolves an acid polymer and as a rinsing liquid that removes the polymer film 101. Therefore, it is possible to further reduce an environmental load.

When the first oxide layer 103 is removed by a continuously-flowing etching liquid, the temperature of the etching liquid becomes low during a period of time during which the etching liquid proceeds from the central side of the upper surface of the substrate W toward the peripheral edge side. Therefore, the amount of etching (amount of the first oxide layer 103 removed) in the peripheral edge region of the upper surface of the substrate W becomes smaller than the amount of etching in the central region of the upper surface of the substrate W because of a drop in temperature of the etching liquid, and there is a concern that the uniformity of the amount of etching at each position of the upper surface of the substrate W will be reduced.

On the other hand, according to the first preferred embodiment, the entirety of the upper surface of the substrate W is covered by the semisolid or solid polymer film 101, and the first oxide layer 103 is removed by the action of the acid polymer in the polymer film 101. Therefore, the acid polymer does not move from the central side of the upper surface of the substrate W toward the peripheral edge side in a state in which the polymer film 101 is formed, and therefore the temperature of a portion, which is contiguous to each position of the upper surface of the substrate W, of the polymer film 101 changes substantially uniformly. Therefore, it is possible to improve uniformity in the amount of etching.

Unlike the first preferred embodiment, in a configuration in which the first oxide layer 103 is removed by a continuously-flowing etching liquid, there is a case in which a liquid that has entered the trench 122 cannot be sufficiently replaced by the etching liquid if the width L of the trench 122 formed in the upper surface of the substrate W is narrow.

Therefore, if the plurality of trenches 122 that differ in the width L from each other are formed in the upper surface of the substrate W, there is a concern that variations will occur in the degree of replacement of a liquid, which has entered the trench 122, by the etching liquid and that the uniformity in the amount of etching in the upper surface of the substrate W will decrease.

Figure 7:
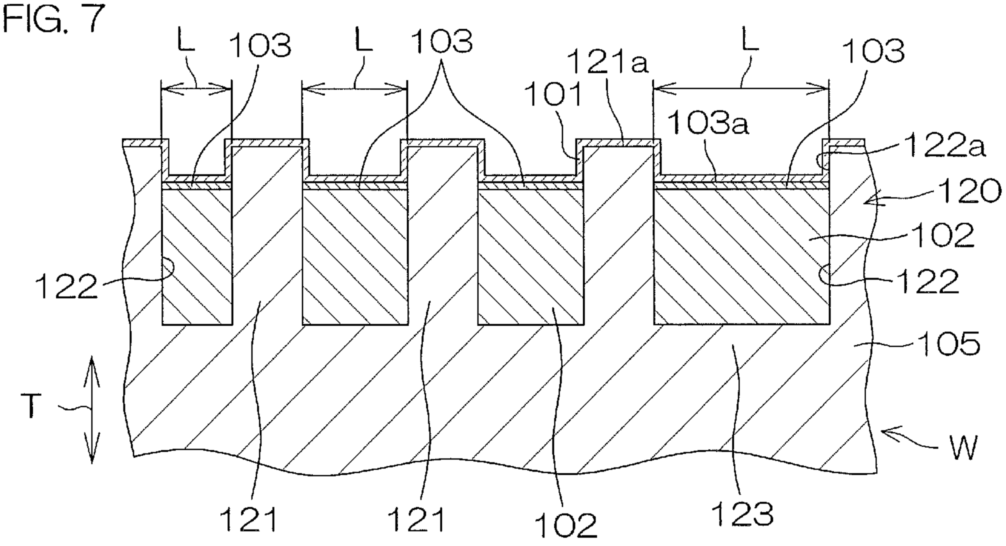
FIG. 7 is a schematic view for describing a structure of the surface layer portion of the substrate when a polymer film is formed.

On the other hand, according to the first preferred embodiment, the polymer film 101 is formed to follow both the to-be-processed layer 102 and the trench 122 regardless of the width L of the trench 122 as shown in FIG. 7. In detail, the polymer film 101 is formed along a front surface 103*a* of the first oxide layer 103, a side surface 122*a* of the trench 122, and a top portion 121*a* of the structure 121. Therefore, it is possible to reduce variations in the amount of etching applied to the to-be-processed layer 102 between the trenches 122 even if the trenches 122 having mutually-different widths L are formed.

Figure 8A:
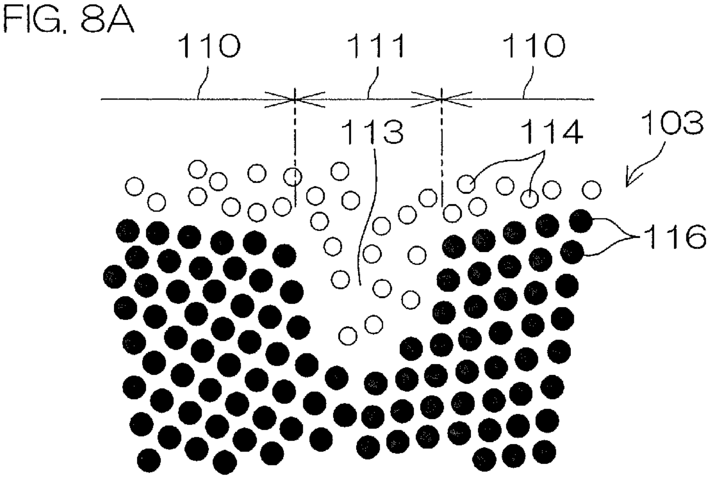
FIG. 8A is a schematic view for describing an aspect in which an oxide layer in a grain boundary is removed by an etching liquid containing a low-molecular-weight etching component.
Figure 8B:
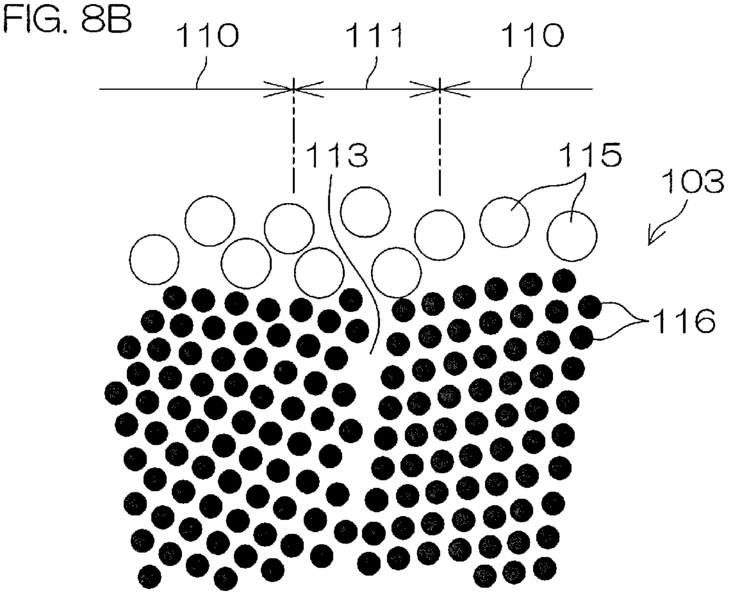
FIG. 8B is a schematic view for describing an aspect in which an oxide layer in a grain boundary is removed by a polymer film.

The distance between constitutive substances 116 of which the first oxide layer 103 is composed in the grain boundary 111 is wider than the distance between constitutive substances 116 in the crystal grain 110 as shown in FIG. 8A and FIG. 8B. Therefore, a gap 113 exists between the constitutive substances 116 in the grain boundary 111. The constitutive substance 116 is, for example, a molecule, and is, typically, a copper oxide molecule.

Unlike the first preferred embodiment, a low-molecular-weight etching component 114 easily enters the gap 113 existing in the grain boundary 111 of the substrate W if the first oxide layer 103 is removed by an etching liquid that contains the low-molecular-weight etching component 114, such as hydrofluoric acid, as shown in FIG. 8A. Therefore, it is easy to remove the first oxide layer 103 in a place having a large grain-boundary density (in the trench 122 having a narrow width L), and it is difficult to remove the first oxide layer 103 in a place having a small grain-boundary density (in the trench 122 having a wide width L). Therefore, there is a concern that the first oxide layer 103 cannot be easily removed evenly and that the roughness (surface roughness) of the upper surface of the substrate W will increase.

On the other hand, according to the first preferred embodiment, an acid polymer 115 that is a high-molecular-weight etching component cannot more easily enter the gap 113 existing in the grain boundary 111 than the low-molecular-weight etching component 114 as shown in FIG. 8B. Therefore, it is possible to evenly etch the first oxide layer 103 regardless of the grain-boundary density. It is possible to reduce the roughness of the upper surface of the substrate W.

Additionally, in the first preferred embodiment, the first oxide layer removing step is again performed subsequent to the first polymer-film removing step if the first cycle processing is performed a plurality of times. Thereby, the polymer film 101 formed on the upper surface of the substrate W is temporarily removed, and then the polymer film 101 is again formed on the upper surface of the substrate W. Therefore, it is possible to remove the polymer film 101 in which the acid polymer has been consumed by removing the first oxide layer 103 from on the upper surface of the substrate W, and is possible to remove the first oxide layer 103 by means of a new polymer film 101. Therefore, a substance required to etch the substrate W is enabled to be made smaller in amount used than a configuration in which the substrate W is etched by repeatedly supplying a liquid oxidant, such as a diluted hydrofluoric acid, and an etching liquid, such as hydrogen peroxide water.

Additionally, in the first preferred embodiment, a rinsing liquid is removed from the upper surface of the substrate W after the polymer film 101 is removed by the rinsing liquid and before the polymer film 101 is newly formed if the first cycle processing is performed a plurality of times. Therefore, it is possible to prevent the polymer film 101, which is being formed, from being removed by the rinsing liquid remaining on the upper surface of the substrate W. This enables the polymer film 101 to sufficiently exhibit the removing action of the first oxide layer 103, thereby making it possible to increase the amount of removal of the first oxide layer 103 by forming the polymer film once. As a result, it is possible to make a substance required to etch the substrate W even smaller in amount used, thereby making it possible to reduce an environmental load.

According to the first preferred embodiment, the acid polymer in the polymer film 101 regains activity by heating the polymer film 101 and by evaporating the alkaline component, and etching is started. Therefore, it is possible to accurately etch the substrate W. Particularly, it is possible to accurately control the starting timing of the etching of the substrate W.

Additionally, according to the first preferred embodiment, it is possible to facilitate ionization of the acid polymer in the polymer film 101 by the action of the electroconductive polymer. Therefore, it is possible to allow the acid polymer to effectively act on the first oxide layer 103.

Second Preferred Embodiment

Figure 9:
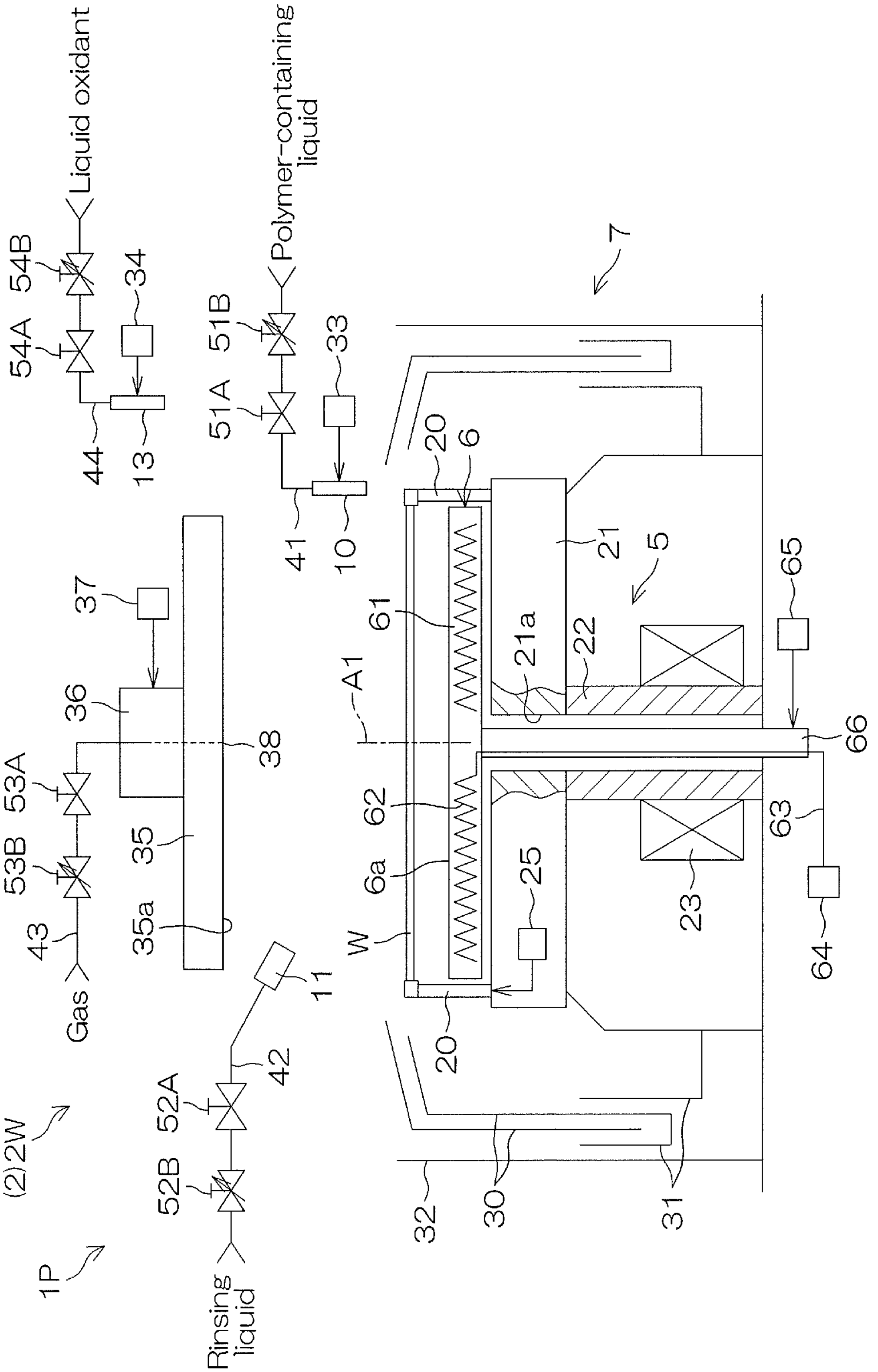
FIG. 9 is a schematic cross-sectional view for describing a configuration example of a wet processing unit included in a substrate processing apparatus according to a second preferred embodiment of the present invention.

FIG. 9 is a schematic cross-sectional view for describing a configuration example of a wet processing unit 2W included in a substrate processing apparatus 1P according to a second preferred embodiment.

The substrate processing apparatus 1P according to the second preferred embodiment differs from the substrate processing apparatus 1 according to the first preferred embodiment mainly in that the wet processing unit 2W additionally includes an oxidant nozzle 13 that supplies a liquid oxidant, such as hydrogen peroxide water, to the upper surface of the substrate W held by the spin chuck 5.

The liquid oxidant is a liquid that oxidizes a surface layer portion of a to-be-processed layer exposed from the upper surface of the substrate W and that forms a second oxide layer at the surface layer portion of the to-be-processed layer 102.

The second oxide layer formed by the liquid oxidant has a thickness of, for example, not less than 1 nm and not more than 2 nm. The to-be-processed layer is oxidized, and, as a result, the second oxide layer is formed. Therefore, the second oxide layer is a metal oxide layer if the to-be-processed layer is a metal layer, whereas the second oxide layer is a silicon oxide layer if the to-be-processed layer is a silicon layer. The second oxide layer has the same property as the first oxide layer. Therefore, the second oxide layer can be removed by an acid polymer included in the polymer film 101.

The liquid oxidant is, for example, hydrogen peroxide water that contains hydrogen peroxide ($H_2O_2$) as an oxidant ($H_2O_2$ water), an APM liquid (ammonia hydrogen peroxide water mixed liquid), ozonized water that contains ozone (03) as an oxidant (03 water), or the like.

The oxidant is not necessarily required to be hydrogen peroxide or ozone. The oxidant is merely required to be an oxidant that is capable of oxidizing the to-be-processed layer exposed from the upper surface of the substrate W. For example, a plurality of oxidants may be contained in the liquid oxidant, and, in detail, the liquid oxidant may be a liquid formed by dissolving both hydrogen peroxide and ozone into water such as DIW. The oxidant nozzle 13 is an example of a substrate oxidation unit.

The oxidant nozzle 13 is a movable nozzle that is movable at least in the horizontal direction. The oxidant nozzle 13 is moved in the horizontal direction by means of a second nozzle moving unit 34 having the same configuration as the first nozzle moving unit 33. The oxidant nozzle 13 may be movable in the vertical direction. Unlike the preferred embodiment, the oxidant nozzle 13 may be a stationary nozzle whose horizontal and vertical positions are fixed.

The oxidant nozzle 13 is connected to an end of an oxidant pipe 44 that guides a liquid oxidant to the oxidant nozzle 13. The other end of the oxidant pipe 44 is connected to an oxidant tank (not shown). An oxidant valve 54A that opens and closes a flow path in the oxidant pipe 44 and an oxidant flow-rate adjusting valve 54B that adjusts the flow rate of a liquid oxidant in this flow path are interposed in the oxidant pipe 44.

When the oxidant valve 54A is opened, a liquid oxidant is discharged downwardly from a discharge port of the oxidant nozzle 13 in a continuous flow at a flow rate according to the opening degree of the oxidant flow-rate adjusting valve 54B.

Figure 10:
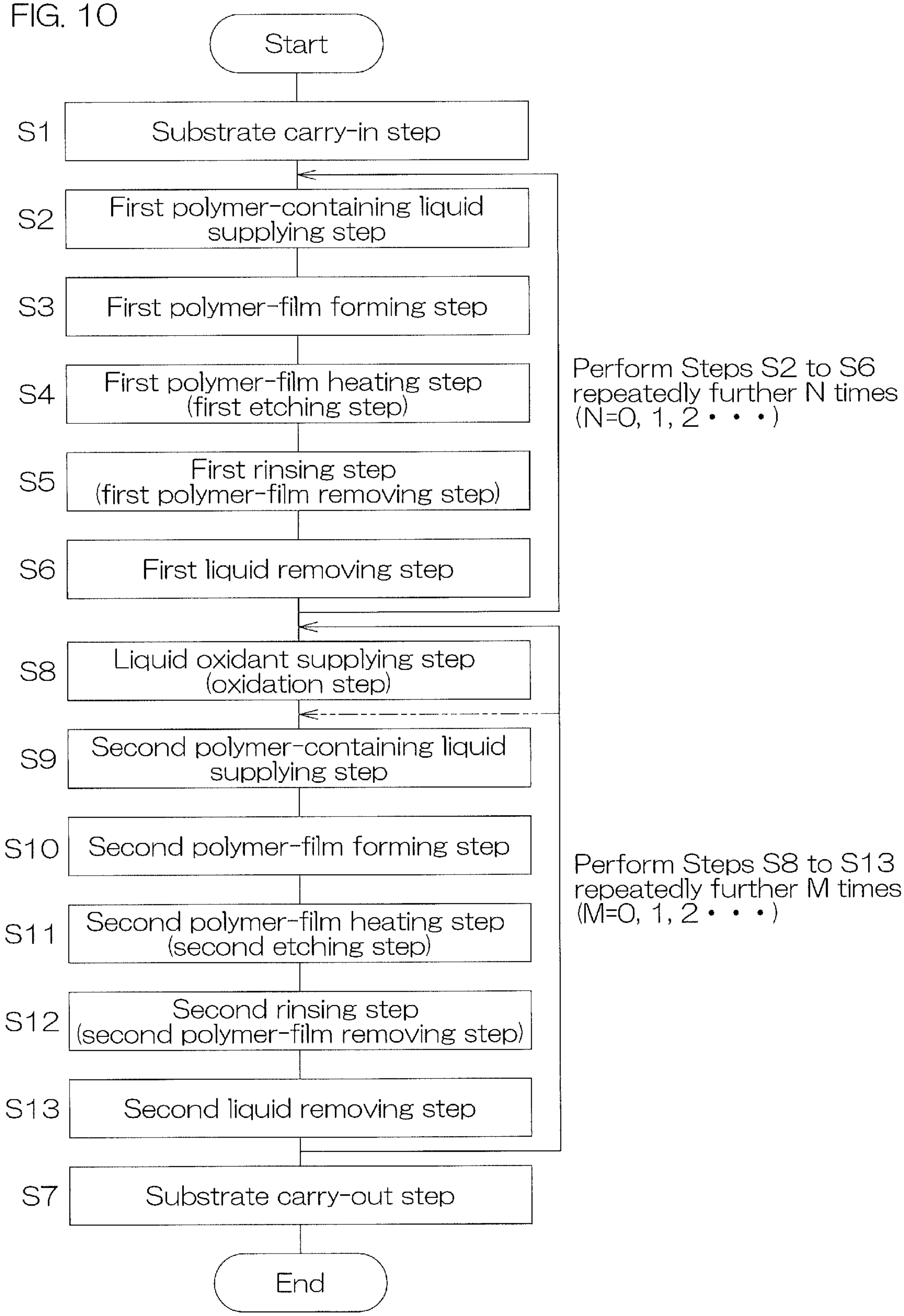
FIG. 10 is a flowchart for describing an example of substrate processing performed by the substrate processing apparatus according to the second preferred embodiment.
Figure 11A:
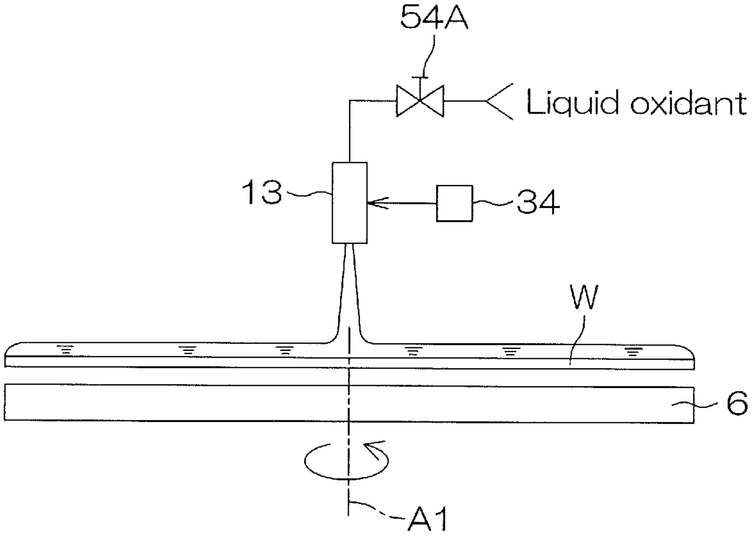
FIG. 11A is a schematic view for describing an aspect of a substrate when the substrate processing according to the second preferred embodiment is performed.
Figure 11B:
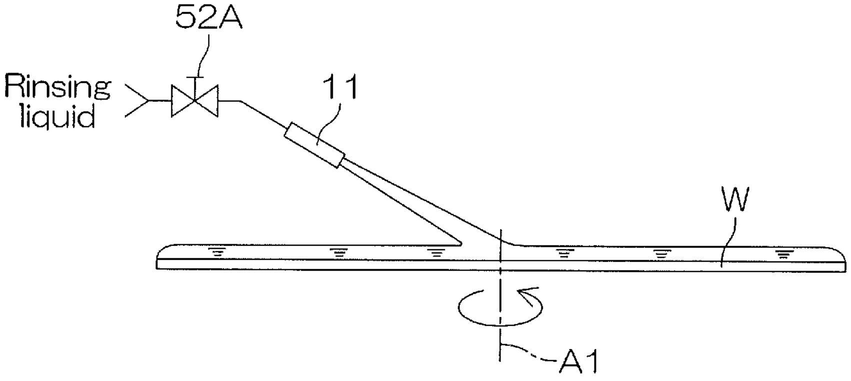
FIG. 11B is a schematic view for describing an aspect of a substrate when the substrate processing according to the second preferred embodiment is performed.

FIG. 10 is a flowchart for describing an example of substrate processing performed by the substrate processing apparatus 1P according to the second preferred embodiment. FIG. 11A and FIG. 11B are schematic views for describing an aspect of a substrate W when the substrate processing according to the second preferred embodiment is performed.

The substrate processing according to the second preferred embodiment shown in FIG. 10 differs from the substrate processing according to the first preferred embodiment (see FIG. 5) mainly in that, subsequent to the last first liquid removing step (Step S6), the second oxide layer is formed at the surface layer portion of the upper surface of the substrate W, and thereafter the second oxide layer is removed.

A difference between the substrate processing according to the second preferred embodiment and the substrate processing according to the first preferred embodiment (see FIG. 5) will be hereinafter described in detail with reference mainly to FIG. 9 and FIG. 10. Reference will be made to FIG. 11A and FIG. 11B where appropriate.

In detail, subsequent to the last liquid removing step (Step S6), the supply (oxidation treatment) of a liquid oxidant to the upper surface of the substrate W is performed (liquid oxidant supplying step (oxidation step): Step S8). First, the second nozzle moving unit 34 moves the oxidant nozzle 13 to the processing position. The processing position of the oxidant nozzle 13 is a central position at which the oxidant nozzle 13 faces the central region of the upper surface of the substrate W.

The oxidant valve 54A is opened in a state in which the oxidant nozzle 13 is placed at the processing position. Thereby, a liquid oxidant is supplied (discharged) from the oxidant nozzle 13 toward the central region of the upper surface of the substrate W as shown in FIG. 11A (liquid oxidant supplying step, liquid oxidant discharging step).

The liquid oxidant supplied to the upper surface of the substrate W spreads to the entirety of the upper surface of the substrate W because of a centrifugal force. The liquid oxidant that has reached the peripheral edge portion of the upper surface of the substrate W is discharged outwardly from the substrate W, i.e., outwardly from the peripheral edge portion of the upper surface of the substrate W. An oxide layer is formed at the to-be-processed layer exposed from the upper surface of the substrate W by supplying a liquid oxidant to the upper surface of the substrate W (second oxide layer forming step, wet oxidation step). In this substrate processing, the substrate W can be oxidized by a simple step of supplying a liquid oxidant to the substrate W.

The liquid oxidant may be heated through the substrate W by use of the heater unit 6 while supplying the liquid oxidant to the upper surface of the substrate W. In detail, the heater unit 6 is placed at the proximal position, and the substrate W, which is being rotated, is heated. The formation of the second oxide layer is facilitated by heating the liquid oxidant (second oxide layer formation facilitating step). Unlike FIG. 11A, the heater unit 6 may be placed at the retreat position, or the heater unit 6 may be placed at the contact position while supplying the liquid oxidant.

The supply of a liquid oxidant is continued during a predetermined period of time, and then a rinsing liquid is supplied to the upper surface of the substrate W, and an oxidant removing step of removing the liquid oxidant from the upper surface of the substrate W is performed. In detail, the oxidant valve 54A is closed, and the rinsing-liquid valve 52A is opened. Thereby, the supply of the liquid oxidant to the upper surface of the substrate W is stopped, and, instead, the supply (discharge) of the rinsing liquid to the upper surface of the substrate W from the rinsing-liquid nozzle 11 is started (rinsing liquid supplying step, rinsing liquid discharging step). Thereby, the liquid oxidant on the substrate W is replaced by the rinsing liquid, and the liquid oxidant is removed from the upper surface of the substrate W as shown in FIG. 11B. In the second preferred embodiment, the rinsing liquid functions also as an oxidant removing liquid that removes the liquid oxidant on the upper surface of the substrate W.

The oxidant valve 54A is closed, and then the second nozzle moving unit 34 moves the oxidant nozzle 13 to the retreat position. When the oxidant nozzle 13 is placed at the retreat position, the oxidant nozzle 13 does not face the upper surface of the substrate W, and is placed outside the processing cup 7 in a plan view.

Thereafter, a second polymer-containing liquid supplying step (Step S9), a second polymer-film forming step (Step S10), a second polymer-film heating step (Step S11), a second polymer-film removing step (Step S12), and a second liquid removing step (Step S13) are performed.

The second polymer-containing liquid supplying step (Step S9), the second polymer-film forming step (Step S10), the second polymer-film heating step (Step S11), the second polymer-film removing step (Step S12), and the second liquid removing step (Step S13) are the same as the first polymer-containing liquid supplying step (Step S2), the first polymer-film forming step (Step S3), the first polymer-film heating step (Step S4), the first polymer-film removing step (Step S5), and the first liquid removing step (Step S6), respectively, and therefore a detailed description of these steps is omitted.

As a supplementary explanation, in the second polymer-film forming step, the substrate W is etched by the polymer film 101 (second polymer film) formed on the substrate W (second etching step), and at least a portion of the second oxide layer is removed from the upper surface of the substrate W by means of the action of the acid polymer in the polymer film 101 (second oxide layer removing step). The second etching step (second oxide layer removing step) is started by heating the polymer film 101 (second etching start step). Additionally, in the second polymer-film removing step, the major surface of the substrate W is washed by the rinsing liquid (second rinsing liquid) (second rinsing step). The rinsing liquid supplied to the upper surface of the substrate W in the second polymer-film removing step functions as the second polymer removing liquid.

Additionally, the acid polymer, the alkaline component, and the electroconductive polymer contained in the second polymer film are an example of a second acid polymer, an example of a second alkali component, and an example of a second electroconductive polymer, respectively.

The formation and the removal of the second oxide layer may be again performed after removing the rinsing liquid from on the upper surface of the substrate W. In other words, after the second polymer-film removing step (strictly, the second liquid removing step) is performed, the liquid oxidant supplying step (oxidation step), the second polymer-film forming step (second etching step), and the second polymer-film removing step (second rinsing step) may be each performed at least once more in this order. Still in other words, cycle processing (which is hereinafter referred to as "second cycle processing" if necessary) ranging from the liquid oxidant supplying step (Step S8) to the second liquid removing step (Step S13) may be performed twice or more.

"M" in FIG. 10 denotes an integer equal to or more than 0. Therefore, the steps of from the liquid oxidant supplying step (Step S8) to the second liquid removing step (Step S13) are each performed once, and, if "M" is 1 or more, the steps of from the liquid oxidant supplying step (Step S8) to the second liquid removing step (Step S13) are each performed twice or more. In other words, if "M" is 1 or more, the second cycle processing is performed a plurality of times.

If "M" is 1 or more, the liquid oxidant supplying step (second oxide layer forming step) and the second polymer-film forming step (second oxide layer removing step) are alternately repeated. In other words, the liquid oxidant supplying step (second oxide layer forming step) and the second polymer-film forming step (second oxide layer removing step) are each alternately performed a plurality of times.

Subsequent to the last second liquid removing step (Step S13), the spin motor 23 stops the rotation of the substrate W. The transfer robot CR enters the wet processing unit 2W, and receives an already-processed substrate W from the plurality of chuck pins 20, and carries this substrate W out of the wet processing unit 2W (substrate carry-out step: Step S7). This substrate W is delivered from the transfer robot CR to the transfer robot IR, and is housed in the carrier C by means of the transfer robot IR.

Figure 12:
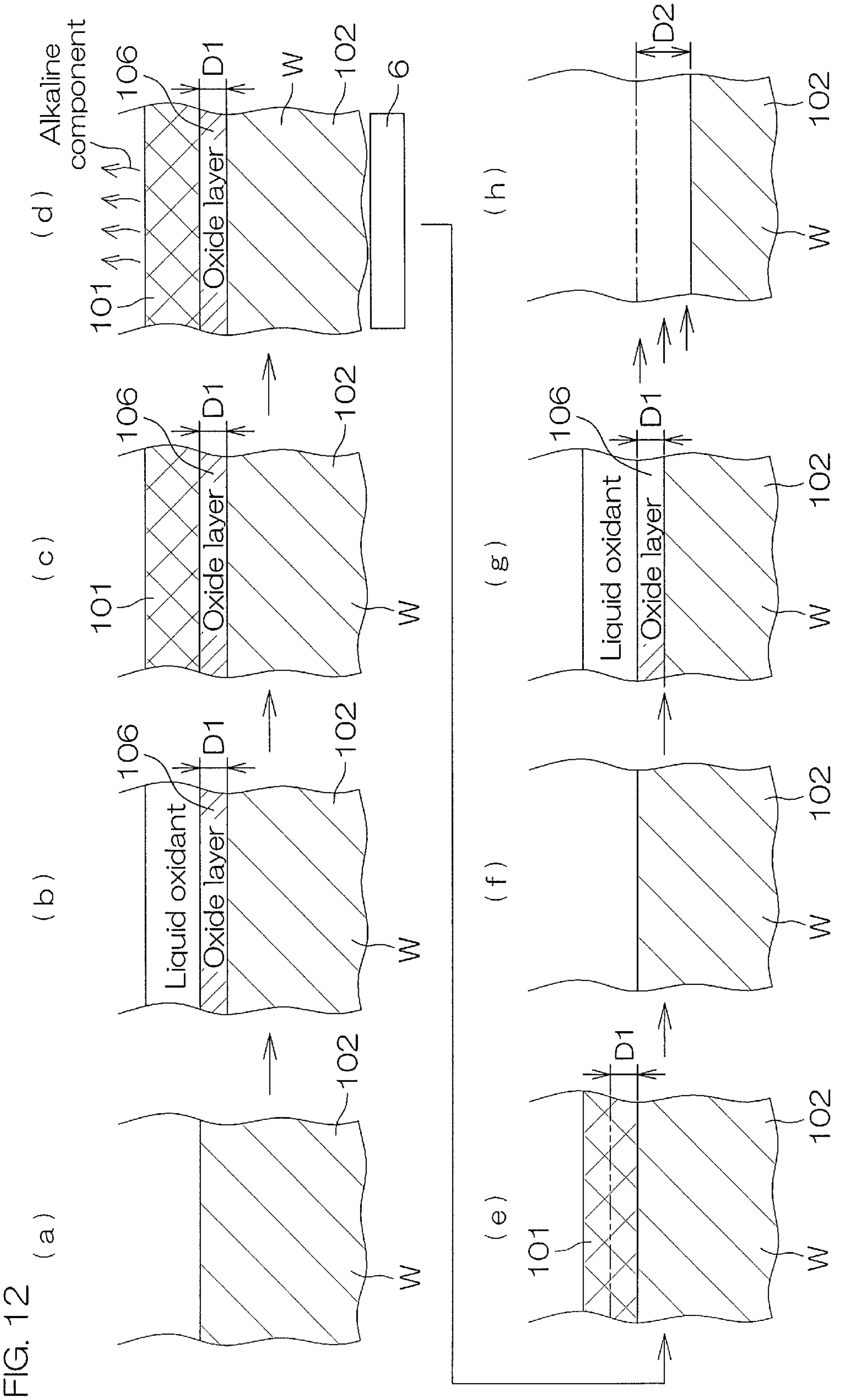
FIG. 12 is a schematic view for describing a change in a surface layer portion of an upper surface of a substrate caused by alternately and repeatedly performing an oxidation step and a second etching step in the substrate processing according to the second preferred embodiment.

FIG. 12 is a schematic view for describing a change in a surface layer portion of an upper surface of a substrate W caused by alternately and repeatedly performing an oxidation step and a second etching step in the substrate processing according to the second preferred embodiment.

A second oxide layer 106 is formed at the surface layer portion of the to-be-processed layer 102 by supplying a liquid oxidant, such as hydrogen peroxide water, to the upper surface of the substrate W as shown in FIG. 12(*a*) and FIG. 12(*b*) (second oxide layer forming step). Thereafter, a polymer-containing liquid is supplied to the upper surface of the substrate W, and at least a portion of the solvent in the polymer-containing liquid on the substrate W is evaporated, and, as a result, a polymer film 101 (second polymer film) is formed on the upper surface of the substrate W as shown in FIG. 12(*c*) (second polymer-film forming step). Thereafter, the alkaline component is evaporated by heating the polymer film 101, and the alkaline component is removed from the polymer film 101 as shown in FIG. 12(*d*) (alkali component evaporating step, alkali component removing step). The second oxide layer 106 is dissolved by the action of the acid polymer in the polymer film 101 on the upper surface of the substrate W, and is dissolved into the polymer film 101. Thereby, the second oxide layer 106 is selectively removed from the upper surface of the substrate W as shown in FIG. 12(*e*) (second oxide layer removing step). FIG. 12(*f*) shows a state of the front surface of the to-be-processed layer 102 from which the polymer film 101 has been removed thereafter.

The oxidation step (second oxide layer forming step) and the second etching step (second oxide layer removing step) are each performed once, and, as a result, the thickness of the to-be-processed layer 102 that is oxidized is substantially constant (see FIG. 12(*b*)). Therefore, the thickness (amount of etching D1) of the second oxide layer 106 that is etched is also substantially constant (see FIG. 12(*e*)).

As shown in FIG. 12(*f*), the second cycle processing is performed a plurality of times of cycles, and, as a result, a portion, which has a thickness D2 corresponding to the product of the amount of etching D1 and the number of cycles, of the to-be-processed layer 102 is etched (removed) from the substrate W (D2=D1×the number of cycles). The amount etched of the to-be-processed layer 102 corresponds to the thickness D2 by performing the second cycle processing a plurality of times of cycles. Therefore, it is possible to achieve a desired amount of etching (which is equal in amount to the thickness D2) by adjusting the number of times by which the oxidation step (second oxide layer forming step) and the second etching step (second oxide layer removing step) are repeatedly performed.

As thus described, the process of etching the to-be-processed layer 102 stepwisely at a predetermined amount etched is referred to as "digital etching." Additionally, the process of etching the to-be-processed layer 102 (surface layer portion of the upper surface of the substrate W) by repeatedly performing the second oxide layer forming step and the second oxide layer removing step is referred to as "cycle etching."

According to the second preferred embodiment, the same effect as in the first preferred embodiment is fulfilled. According to the second preferred embodiment, the following effects are additionally fulfilled.

According to the second preferred embodiment, the last first rinsing step is performed, and then oxidation treatment is applied onto the upper surface of the substrate W, and then the substrate W is etched. Therefore, it is possible to sufficiently secure the amount of etching by additionally etching the substrate W. Therefore, it is possible to etch the substrate W more excellently.

In detail, the first oxide layer 103 (see FIG. 1) is removed, and then the second oxide layer 106 is formed at the surface layer portion of the front surface of the to-be-processed layer 102. Thereafter, oxidation treatment is performed, and then the formation and the removal of the polymer film 101 are performed, and, as a result, the second oxide layer 106 is removed from on the to-be-processed layer 102. In other words, both the first oxide layer 103 that has been beforehand formed and the second oxide layer 106 that has been formed through the second oxide layer forming step are removed. Therefore, if the amount of etching of the substrate W is insufficient only by the removal of the first oxide layer 103, it is possible to sufficiently secure the amount of etching by oxidizing the to-be-processed layer 102, and, as a result, additionally forming the second oxide layer 106, and then removing the second oxide layer 106.

Additionally, when the second oxide layer 106 is removed, the polymer film 101 is used in the same way as when the first oxide layer 103 is removed. Therefore, it is possible to reduce a substance required to etch the substrate W smaller in amount used.

Additionally, if the second cycle processing is performed a plurality of times in the second preferred embodiment, the oxidation step, the second etching step, and the second rinsing step are each performed at least once more in this order after the second rinsing step is performed. In other words, the formation and the removal of the second oxide layer 106 are alternately performed a plurality of times. Therefore, the formation and the removal of the second oxide layer 106 that is small in amount (for example, not less than 1 nm and not more than 10 nm) can be repeatedly performed. Therefore, it is possible to more easily adjust the amount of etching of the substrate W than in a case in which the formation and the removal of the second oxide layer 106 that is large in amount are performed at a time. As a result, it is possible to accurately etch the substrate W.

Additionally, according to the second preferred embodiment, the acid polymer in the polymer film 101 regains activity by heating the polymer film 101 formed through the second polymer-film forming step and by evaporating the alkaline component, and etching is started. Therefore, it is possible to accurately etch the substrate W. Particularly, it is possible to accurately control the starting timing of the etching of the substrate W.

Additionally, according to the second preferred embodiment, it is possible to facilitate ionization of the acid polymer in the polymer film 101 by the action of the electroconductive polymer also in the second etching step. Therefore, it is possible to allow the acid polymer to effectively act on the first oxide layer 103.

Other Preferred Embodiments

The present invention is not limited to the preferred embodiment described above but can further be implemented in other modes.

An acid polymer, an alkaline component, and an electroconductive polymer are each contained in a polymer-containing liquid as a solute. However, the alkaline component and the electroconductive polymer are not necessarily required to be contained in the polymer-containing liquid. Only either one of the alkaline component and the electroconductive polymer, in addition to the acid polymer, is not necessarily required to be contained in the polymer-containing liquid as a solute.

Figure 13:
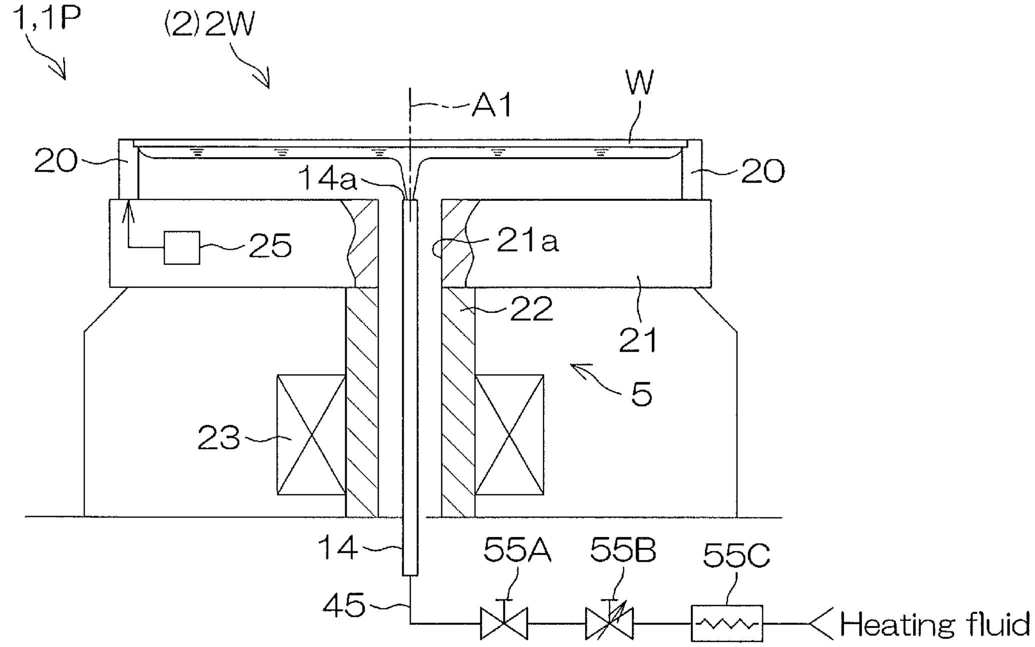
FIG. 13 is a schematic cross-sectional view for describing a modification of the wet processing unit included in the substrate processing apparatus.

A means for heating the polymer film 101 is not limited to the heater unit 6. For example, the means for heating the polymer film 101 may be a heater facing the upper surface of the substrate W (not shown). Additionally, the means for heating the polymer film 101 may be configured to heat the polymer film 101 through the substrate W by supplying a heating fluid from the heating fluid nozzle 14 facing the lower surface of the substrate W to the lower surface of the substrate W as shown in FIG. 13.

The heating fluid discharged from the heating fluid nozzle 14 is, for example, high-temperature DIW whose temperature is higher than a normal temperature and whose temperature is lower than the boiling point of a solvent contained in the polymer-containing liquid. DIW, which is, for example, equal to or more than 60° C. and is less than 100° C., is used as the heating fluid if the solvent contained in the polymer-containing liquid is DIW. The heating fluid discharged from the heating fluid nozzle 14 is not limited to high-temperature DIW, and may be a high-temperature gas, such as high-temperature inert gas or high-temperature air, whose temperature is higher than a normal temperature and whose temperature is lower than the boiling point of a solvent contained in the polymer-containing liquid.

The heating fluid nozzle 14 is inserted in, for example, the through-hole 21*a* of the spin base 21. The discharge port 14*a* of the heating fluid nozzle 14 faces the central region of the lower surface of the substrate W from below. A heating fluid pipe 45 that guides a heating fluid to the heating fluid nozzle 14 is connected to the heating fluid nozzle 14. A heating fluid valve 55A that opens and closes a flow path in the heating fluid pipe 45 and a heating fluid flow-rate adjusting valve 55B that adjusts the flow rate of the heating fluid in the heating fluid pipe 45 are interposed in the heating fluid pipe 45. A heater 55C (temperature adjusting unit) that adjusts the temperature of the heating fluid supplied to the heating fluid nozzle 14 may be provided.

Additionally, in the first polymer-film heating step (Step S4) of each of the preferred embodiments described above, the heating of the polymer film 101 may be started in a state in which an atmosphere contiguous to the substrate W has been replaced by an inert gas, such as nitrogen gas. This makes it possible to prevent an unintentional oxide layer from being formed after removing the first oxide layer 103. Likewise, in the second polymer-film heating step (Step S11), the heating of the polymer film 101 may be started in a state in which an atmosphere contiguous to the substrate W has been replaced by an inert gas, such as nitrogen gas.

Additionally, the spin chuck 5 is not limited to a gripping-type chuck, and may be, for example, a vacuum-suction-type vacuum chuck (not shown). The vacuum chuck holds the substrate W in a horizontal attitude at the holding position by vacuum-sucking the rear surface of the substrate W, and rotates around a vertical rotational axis in that state, and, as a result, rotates the substrate W held by the spin chuck 5.

Additionally, in the preferred embodiments described above, the polymer-containing liquid is supplied to the upper surface of the substrate W, and then the solvent is evaporated from these liquids, and, as a result, the polymer film 101 is formed on the upper surface of the substrate W. However, unlike the preferred embodiments described above, the polymer film 101 may be formed on the upper surface of the substrate W by applying the semisolid polymer film 101 to the upper surface of the substrate W.

Additionally, the surface layer portion of the major surface of the substrate W for use in the substrate processing according to the preferred embodiments described above is not required to have the structure shown in FIG. 1. For example, the to-be-processed layer 102 may be exposed from the entirety of the major surface of the substrate W, and the concavo-convex pattern 120 is not necessarily required to be formed. Additionally, the to-be-processed layer 102 is not required to be made of a single substance, and may be made of a plurality of substances.

Additionally, the first polymer-film heating step (Step S4) may be appropriately omitted in the substrate processing (see FIG. 5) according to the first preferred embodiment mentioned above. Still additionally, it is possible to remove the rinsing liquid from the upper surface of the substrate W by stopping the supply of the rinsing liquid without accelerating the rotation of the substrate W in the first liquid removing step (Step S6) of the substrate processing according to the first preferred embodiment. In this case, the rinsing liquid is not removed to such a degree that the upper surface of the substrate W becomes dry, and the rinsing liquid slightly remains on the upper surface of the substrate W, and yet the acceleration of the rotation of the substrate W can be omitted, and therefore it is possible to reduce a period of time required for substrate processing.

However, preferably, the rotation of the substrate W is accelerated to a drying speed in the last first liquid removing step (Step S6). If so, it is possible to carry the substrate W out of the wet processing unit 2W in a state in which the upper surface of the substrate W has been sufficiently dried.

Likewise, the first polymer-film heating step (Step S4) and the second polymer-film heating step (Step S11) may be appropriately omitted in the substrate processing (see FIG. 10) according to the second preferred embodiment mentioned above. Additionally, the rinsing liquid may be removed from the upper surface of the substrate W by stopping the supply of the rinsing liquid without accelerating the rotation of the substrate W in the first liquid removing step (Step S6) and the second liquid removing step (Step S13) of the substrate processing according to the second preferred embodiment. In this case, the rinsing liquid is not removed to such a degree that the upper surface of the substrate W becomes dry, and the rinsing liquid slightly remains on the upper surface of the substrate W, and yet the acceleration of the rotation of the substrate W can be omitted, and therefore it is possible to reduce a period of time required for substrate processing.

However, preferably, the rotation of the substrate W is accelerated to a drying speed in the last second liquid removing step (Step S13). If so, it is possible to carry the substrate W out of the wet processing unit 2W in a state in which the upper surface of the substrate W has been sufficiently dried.

Additionally, the second oxide layer is formed by the supply of the liquid oxidant in the substrate processing (see FIG. 10) according to the second preferred embodiment. In other words, the liquid oxidant is supplied as oxidation treatment. However, the oxidation treatment is not limited to the supply of the liquid oxidant, and the second oxide layer may be formed by a dry oxidation step that does not use a liquid. The dry oxidation step may be performed by, for example, light irradiation (for example, UV irradiation), heating, a gaseous oxidant, or the like. The gaseous oxidant is an oxidant of a gas, such as an ozone gas.

Additionally, if all of the second oxide layer 106 is not removed by forming the polymer film 101 once in the second preferred embodiment mentioned above, the process may return to the second polymer-containing liquid supplying step (Step S9) without returning to the oxidation step (Step S8) after the second liquid removing step (Step S13) (see the alternate long and two short dashed line of FIG. 10). In other words, the steps of from the second polymer-containing liquid supplying step (Step S9) to the second liquid removing step (Step S13) may be each performed once more.

In other words, the second polymer-film forming step and the second polymer-containing liquid supplying step are each performed at least once more in this order after the oxidation step is performed. The second etching step is further performed after the second polymer-film removing step, and therefore the polymer film 101 formed on the upper surface of the substrate W is temporarily removed, and the polymer film 101 is formed again on the upper surface of the substrate. Therefore, it is possible to remove the polymer film 101 in which the acid polymer has been consumed by removing the second oxide layer 106 from on the upper surface of the substrate W, and is possible to remove the second oxide layer 106 by means of a new polymer film 101. Therefore, the second oxide layer 106 can be sufficiently etched by performing the formation and the removal of the polymer film 101 a plurality of times even if a desired amount of the second oxide layer 106 is not etched by performing the formation and the removal of the polymer film 101 once. For example, the second oxide layer 106 may be thoroughly removed from the substrate W by performing the formation and the removal of the polymer film 101 a plurality of times.

Additionally, in the second preferred embodiment, the acid polymer in the first polymer film formed on the upper surface of the substrate W through the first polymer-film forming step and the acid polymer in the second polymer film formed on the upper surface of the substrate W through the second polymer-film forming step may be mutually-different substances.

Additionally, in the preferred embodiments described above, the removal of the first polymer film and the removal of the second polymer film are performed by the supply of the rinsing liquid. However, unlike the preferred embodiments described above, the first polymer film and the second polymer film may be removed by plasma treatment or light irradiation treatment in which light, such as UV, is irradiated.

Additionally, each component in the first polymer film (first acid polymer, first alkali component, first electroconductive polymer) and each corresponding component in the second polymer film (second acid polymer, second alkali component, second electroconductive polymer) may be mutually different. In that case, a polymer-containing liquid used to form the first polymer film and a polymer-containing liquid used to form the second polymer film are required to be individually prepared.

Additionally, in each of the preferred embodiments described above, substrate processing including the etching performed by the polymer film 101 is applied to the upper surface of the substrate W. However, substrate processing may be applied to the lower surface of the substrate W unlike the preferred embodiments described above.

Additionally, in the preferred embodiments described above, each of the substrate processing apparatuses 1 and 1P includes the transfer robots IR, CR, the plurality of processing units 2, and the controller 3. However, each of the substrate processing apparatuses 1 and 1P may include the single processing unit 2 and the controller 3 without including the transfer robots IR and CR. Alternatively, the substrate processing apparatus 1 may be composed only of the single processing unit 2. In other words, the processing unit 2 may be an example of a substrate processing apparatus.

In each of the preferred embodiments described above, there is a case in which each constituent is schematically shown in a block, and yet the shape, the size, and the positional relationship of each block do not show the shape, the size, and the positional relationship of each constituent.

It should be noted that the terms "along," "horizontal," and "vertical" have been used in the preferred embodiments described above, and yet these are not required to be precisely "along," precisely "horizontal," and precisely "vertical." In other words, these terms permit an error in manufacturing accuracy, installing accuracy, etc.

While the preferred embodiments of the present invention have been described in detail, these are merely specific examples used to clarify the technical content of the present invention and the present invention should not be interpreted as being limited to these specific examples, and the scope of the present invention shall be limited only by the appended claims.

This application corresponds to Japanese Patent Application No. 2021-046461 filed on Mar. 19, 2021 with the Japan Patent Office, and the entire disclosure of this application is incorporated herein by reference.

REFERENCE SIGNS LIST

1: Substrate processing apparatus
1P: Substrate processing apparatus
2: Processing unit (substrate processing apparatus)
10: Polymer-containing liquid nozzle (polymer-film forming unit)
11: Rinsing-liquid nozzle (polymer removing liquid supply unit)
101: Polymer film (first polymer film, second polymer film)
102: To-be-processed layer (surface layer portion of major surface of substrate)
103: First oxide layer
106: Second oxide layer
115: Acid polymer
W: Substrate

The invention claimed is:

1. A substrate processing method comprising:
preparing a substrate having a major surface from which a first oxide layer is exposed;
forming a first polymer film that contains a first acid polymer on the major surface of the substrate;
performing a first etching on the substrate; and
a first rinsing of supplying a first rinsing liquid to the major surface of the substrate after the first etching so that the first rinsing liquid washes the major surface of the substrate, wherein
the first polymer film additionally contains a first alkali component, and
the first etching includes a first etching start of starting etching the substrate by heating the first polymer film and evaporating the first alkali component from the first polymer film after the first polymer film is formed.

2. The substrate processing method according to claim 1, wherein the first polymer film additionally contains a first electroconductive polymer.

3. The substrate processing method according to claim 1, wherein the first etching includes removing at least a portion of the first oxide layer by the first acid polymer in the first polymer film, and
the first rinsing includes removing the first polymer film from the major surface of the substrate by the first rinsing liquid.

4. The substrate processing method according to claim 1, wherein the forming the first polymer film, the first etching and the first rinsing are each performed at least once more in this order after the first rinsing.

5. The substrate processing method according to claim 4, further comprising removing the first rinsing liquid from the major surface of the substrate after the first rinsing is completed and before the forming the first polymer film subsequent to the first rinsing.

6. The substrate processing method according to claim 1, further comprising supplying a polymer-containing liquid that contains a solvent and the first acid polymer to the major surface of the substrate before the first etching,
wherein the first etching includes forming the first polymer film by evaporating at least a portion of the solvent in the polymer-containing liquid on the major surface of the substrate.

7. The substrate processing method according to claim 1, wherein the first acid polymer is a carboxyl-containing polymer, a sulfo-containing polymer, or a mixture of these polymers.

8. A substrate processing method comprising:
preparing a substrate having a major surface from which a first oxide layer is exposed;
forming a first polymer film that contains a first acid polymer on the major surface of the substrate;
performing a first etching on the substrate;
a first rinsing of supplying a first rinsing liquid to the major surface of the substrate after the first etching so that the first rinsing liquid washes the major surface of the substrate;
an oxidation of applying oxidation treatment onto the major surface of the substrate after the last first rinsing;
forming a semisolid or solid second polymer film that contains a second acid polymer on the major surface of the substrate after the oxidation;
performing a second etching on the substrate; and
a second rinsing of supplying the second rinsing liquid to the major surface of the substrate after the second etching.

9. The substrate processing method according to claim 8, wherein the second polymer film additionally contains a second alkali component, and
the second etching includes a second etching start of starting etching the substrate by heating the second polymer film and by evaporating the second alkali component from the second polymer film after the second polymer film is formed.

10. The substrate processing method according to claim 8, wherein the second polymer film additionally contains a second electroconductive polymer.

11. The substrate processing method according to claim 8, wherein the oxidation includes forming a second oxide layer at a surface layer portion of the major surface of the substrate,
the second etching includes removing at least a portion of the second oxide layer by the second acid polymer in the second polymer film, and
the second rinsing includes removing the second polymer film from the major surface of the substrate by the second rinsing liquid after the second etching.

12. The substrate processing method according to claim 8, wherein the oxidation, the forming the semisolid or solid second polymer film, the second etching, and the second rinsing are each performed at least once more in this order after the second rinsing.

13. The substrate processing method according to claim 9, wherein the second polymer film additionally contains a second electroconductive polymer.

14. A substrate processing method comprising:
preparing a substrate having a major surface from which a first oxide layer is exposed;
forming a first polymer film that contains a first acid polymer and a solvent on the major surface of the substrate;
performing a first etching on the substrate with the first polymer film containing the first acid polymer and the solvent formed on the major surface; and
a first rinsing of supplying a first rinsing liquid to the major surface of the substrate after the first etching so that the first rinsing liquid washes the major surface of the substrate.

* * * * *